(12) United States Patent
Kinlen

(10) Patent No.: US 7,361,413 B2
(45) Date of Patent: Apr. 22, 2008

(54) ELECTROLUMINESCENT DEVICE AND METHODS FOR ITS PRODUCTION AND USE

(75) Inventor: Patrick J. Kinlen, Fenton, MO (US)

(73) Assignee: Lumimove, Inc., St. Louis, MO (US)

( * ) Notice: Subject to any disclaimer, the term of this patent is extended or adjusted under 35 U.S.C. 154(b) by 800 days.

(21) Appl. No.: 10/352,476

(22) Filed: Jan. 28, 2003

(65) Prior Publication Data

US 2004/0018382 A1   Jan. 29, 2004

Related U.S. Application Data

(63) Continuation-in-part of application No. 10/207,576, filed on Jul. 29, 2002, now Pat. No. 7,029,763.

(51) Int. Cl.
*H01J 1/62* (2006.01)
(52) U.S. Cl. .............. 428/690; 428/917; 313/503; 313/509
(58) Field of Classification Search ........... 428/690, 428/917; 313/503, 509, 510, 506, 504; 257/40; 252/301.65
See application file for complete search history.

(56) References Cited

U.S. PATENT DOCUMENTS

| | | | |
|---|---|---|---|
| 2,924,732 A | 2/1960 | Lehmann | 313/108 |
| 3,052,810 A | 9/1962 | Mash | 313/108 |
| 3,621,321 A | 11/1971 | Williams et al. | 313/108 A |
| 4,263,339 A | 4/1981 | Fischer | 427/64 |
| 4,539,507 A | 9/1985 | VanSlyke et al. | 313/504 |
| 4,672,265 A | 6/1987 | Eguchi et al. | 313/504 |
| 4,855,189 A | 8/1989 | Simopoulos et al. | 428/690 |
| 4,855,190 A | 8/1989 | Bezner | 428/690 |
| 4,857,416 A | 8/1989 | Kreiling et al. | 428/690 |
| 5,247,190 A | 9/1993 | Friend et al. | 257/40 |
| 5,309,070 A | 5/1994 | Sun et al. | 313/503 |
| 5,309,071 A | 5/1994 | Karam et al. | 313/509 |
| 5,426,792 A | 6/1995 | Murasko | 2/422 |
| 5,457,565 A | 10/1995 | Namiki et al. | 359/273 |

(Continued)

FOREIGN PATENT DOCUMENTS

EP   0294061 A1   7/1988

(Continued)

OTHER PUBLICATIONS

Article published in Bull. Korean Chem. Soc., vol. 20, No. 9, 1999 by Jeong Hee Han et al. entitled Correlation between Energy Transfer and Phase Separation in Emissive Polymer Blends.

(Continued)

*Primary Examiner*—Terrel Morris
*Assistant Examiner*—Camie S. Thompson
(74) *Attorney, Agent, or Firm*—Nelson Mullins Riley & Scarborough, LLP

(57) ABSTRACT

A luminescent device comprises an electroluminescent phosphor in operative contact with a light-emitting material wherein excitation of the electroluminescent phosphor by an alternating current electrical field causes the emission of light by the light-emitting material. Methods of making the device and using it in an electroluminescent display are also described.

70 Claims, 4 Drawing Sheets

U.S. PATENT DOCUMENTS

| | | | |
|---|---|---|---|
| 5,543,237 A | 8/1996 | Watanabe | 428/691 |
| 5,552,679 A | 9/1996 | Murasko | 315/169.3 |
| 5,554,449 A | 9/1996 | Tonomura et al. | 428/690 |
| 5,583,394 A | 12/1996 | Burbank et al. | 313/498 |
| 5,593,782 A | 1/1997 | Budd | 428/403 |
| 5,598,058 A | 1/1997 | LaPointe | 313/503 |
| 5,598,059 A | 1/1997 | Sun et al. | 313/509 |
| 5,602,445 A | 2/1997 | Solanki et al. | 313/503 |
| 5,612,591 A | 3/1997 | Katayama et al. | 313/503 |
| 5,635,110 A | 6/1997 | Chadha et al. | 252/301.4 R |
| 5,643,496 A | 7/1997 | Brese et al. | 252/301.65 |
| 5,652,067 A | 7/1997 | Ito et al. | 428/690 |
| 5,663,573 A * | 9/1997 | Epstein et al. | 257/40 |
| 5,667,724 A | 9/1997 | Petersen | 252/301.6 |
| 5,675,217 A | 10/1997 | Kang | 313/509 |
| 5,677,594 A | 10/1997 | Sun et al. | 313/503 |
| 5,682,043 A | 10/1997 | Pei et al. | 257/40 |
| 5,700,591 A | 12/1997 | Okajima et al. | 428/690 |
| 5,700,592 A | 12/1997 | Mueller et al. | 428/690 |
| 5,702,643 A | 12/1997 | Reddy et al. | 252/301.65 |
| 5,711,898 A | 1/1998 | Reddy et al. | 252/301.65 |
| 5,779,346 A * | 7/1998 | Burke | 362/84 |
| 5,856,031 A | 1/1999 | Burrows | 428/690 |
| 5,912,533 A * | 6/1999 | Lee et al. | 313/503 |
| 5,976,613 A | 11/1999 | Janusauskas | 427/66 |
| 6,023,371 A | 2/2000 | Onitsuka et al. | 359/620 |
| 6,053,795 A | 4/2000 | Whitney et al. | 446/219 |
| 6,198,220 B1 | 3/2001 | Jones et al. | 313/512 |
| 6,203,391 B1 | 3/2001 | Murasko | 445/24 |
| 6,218,774 B1 | 4/2001 | Pope | 313/461 |
| 6,258,954 B1 | 7/2001 | Kunimoto et al. | 546/36 |
| 6,392,786 B1 | 5/2002 | Albert | 359/296 |
| 6,406,803 B1 * | 6/2002 | Abe et al. | 428/690 |
| 6,424,088 B1 | 7/2002 | Murasko | 313/506 |
| 6,489,045 B1 | 12/2002 | Araki et al. | 428/690 |
| 6,498,049 B1 | 12/2002 | Friend et al. | 438/34 |
| 6,559,449 B2 | 5/2003 | Ikeda et al. | 250/361 |
| 6,562,460 B1 | 5/2003 | Bayless | 428/402.24 |
| 6,610,223 B2 | 8/2003 | Lee | 264/9 |
| 6,611,109 B2 | 8/2003 | Zovko et al. | 315/169.3 |
| 6,613,455 B1 * | 9/2003 | Matsumoto et al. | 428/690 |
| 6,706,551 B2 * | 3/2004 | Andriessen | 438/99 |
| 6,893,032 B2 | 5/2005 | Kershaw | 280/79.5 |
| 6,903,505 B2 * | 6/2005 | McNulty et al. | 313/504 |
| 6,936,783 B2 * | 8/2005 | Kawaguchi et al. | 200/514 |
| 2001/0030325 A1 | 10/2001 | Epstein et al. | |
| 2001/0035716 A1 * | 11/2001 | Murasko | 313/510 |
| 2001/0042329 A1 | 11/2001 | Murasko et al. | |
| 2002/0011786 A1 | 1/2002 | Murasko et al. | |
| 2002/0155214 A1 | 10/2002 | Murasko et al. | |
| 2002/0157173 A1 * | 10/2002 | Murasko et al. | 2/425 |
| 2002/0159245 A1 | 10/2002 | Murasko et al. | |
| 2002/0159246 A1 | 10/2002 | Murasko et al. | |
| 2003/0015962 A1 * | 1/2003 | Murasko et al. | 313/509 |
| 2003/0032361 A1 | 2/2003 | Murasko et al. | |
| 2003/0099884 A1 | 5/2003 | Chiang et al. | 429/233 |
| 2003/0140768 A1 | 7/2003 | Barnardo | 84/477 R |
| 2004/0217929 A1 | 11/2004 | Albert et al. | 345/84 |

FOREIGN PATENT DOCUMENTS

WO    WO 98/53645    * 11/1998

OTHER PUBLICATIONS

Article published in Nano Letters, vol. 1, No. 8, 2001, pp. 429-433 by J.F. Suyver et al. entitled Synthesis and Photoluminescence of Nanocrystalline ZnS:$Mn^{2+}$.

Article by David Lieberman published online by EETimes at http://www.eetimes.com/story/OEG20000919S0014, Nov. 14, 2002.

Article published in Chem. Rev., 102, 2002, pp. 2357-2368, by Junji Kido et al. entitled Organo Lanthanide Metal Complexes for Electroluminescent Materials.

Article in the Handbook of Conducting Polymers by T.A. Skotheim et al. Eds., Marcel Dekker, Inc., New York, 1998, pp. 823-845, by R. H. Friend et al. entitled Electroluminescence in Conjugated Polymers.

Article published in the Journal of Molecular Electronics, vol. 4, 1998, pp. 37-46, by R.H. Friend entitled Optical Investigations of Conjugated Polymers.

Article published in the Japanese Journal of Applied Physics, vol. 21, No. 6, Jun. 1982, pp. 860-864, by Kenzo Kojima et al. entitled Electroluminescence in Polyethylene Terephthalate (PET) I. Impulse Voltage.

Article published in J. Chem. Soc.; Chem. Commun., 1983, pp. 954-955, by Denis G. H. Ballard et al. entitled A Biotech Route to Polyphenylene.

Article published in Polymer, vol. 30, Jun. 1989, (Conference issue) by John D. Stenger-Smith et al. entitled Spectroscopic and cyclic voltammetric studies of poly ($p$-phenylene vinylene) prepared from two different sulphonium salt precursor polymers.

Article published in J. Phys. D (Applied Physics), vol. 20, 1987, pp. 1389-1410, by D. D. C. Bradley entitled Precursor-route poly (p-phenylenevinylene): polymer charaterization and control of electronic properties.

Article published in Synthetic Metals (28), 1989, pp. C687-C690, by H. Tomozawa et al. entitled Metal-Polymer Schottky Barriers on Processible Polymers.

Article in Luminescence of Solids, edited by D. R. Vij, Plenum Press, New York, 1998, pp. 221-269 by H. E. Gumlich et al. entitled Electroluminescence.

Article published online at http://www.geocities.com/Athens/Bridge/2702/CAP4l.htm entitled Display Devices.

Article in Advanced Materials, 14, No. 16, Aug. 16, 2002, pp. 1147-1150, by G. A. Hebbink et al. entitled Lanthanide (III)-Doped Nanoparticles That Emit in the Near-Infrared.

"Zinc Sulfide" online at http://ncsr.csci-va.com/materials/zns.asp, Oct. 28, 2002.

Proceedings of the 2nd International Symposium on Advanced Luminescent Materials and Quantum Confinement, 201st Meeting of the Electrochemical Society, 185, 2002, by J. F. Suyver et al. entitled (Electro) Luminescence of Solutions, Powders and Layers of ZnSe:Cu Nanocrystals.

I-components website, Technology, at http://www.i-components.co.kr/korean/technology.htm, Nov. 14, 2002.

Orgacon Conductive Transparent Films, Application Sheet, entitled Patterning Orgacon Film by Means of UV Lithography, AGFA, revised May 2001.

http://www.kressworks.com/Research/Qu.../Electroluminescence_Of_Organic_Polymer.ht, Jul. 3, 2002.

European Patent Office Supplementary European Search Report, completion date May 3, 2006, date mailed May 11, 2006, EP 02 71 9332.

* cited by examiner (a)

(b)

ELECTROLUMINESCENT DEVICE AND METHODS FOR ITS PRODUCTION AND USE

CROSS REFERENCE TO RELATED PATENTS AND PATENT APPLICATIONS

The subject matter of the present invention is related to and claims the benefit of copending and commonly assigned U.S. patent application Ser. No. 10/207,576, filed Jul. 29, 2002, which is relied on herein and incorporated herein by reference in its entirety.

BACKGROUND OF THE INVENTION (1) Field of the Invention

The present invention relates to electroluminescent devices, and more particularly to alternating-current powered electroluminescent devices.

(2) Description of the Related Art

Luminescence is a general term that is used to describe the emission of radiation from a solid when it is supplied with some form of energy. The various types of luminescence can be distinguished by the method of excitation that is used to supply the energy. Electroluminescence excitation results from the application of an electric field, which may be either AC or DC. Whatever the form of energy input to the luminescing material, the final stage in the process is an electronic transition between two energy levels. See, e.g. Display Devices, at http/www/geocities.com/Athens/Bridge/2702/CAP4I (Oct. 28, 2002).

Fluorescence occurs when a material emits visible light after being excited by an excitation source applied from outside. A fluorescent lamp, a discharge tube, and a cathode ray tube utilize fluorescence. A material that emits fluorescence is called a phosphor.

Electroluminescence is a solid state phenomenon, which involves the emission of visible or invisible radiation as a result of the absorption of exciting energy. It is a general term which includes both fluorescence and phosphorescence. Invisible light further includes infrared and ultraviolet radiation.

An electroluminescent (EL) display device generally includes a layer of phosphor positioned between two electrodes, with at least one of the electrodes being light-transmissive. At least one dielectric also is positioned between the electrodes so the EL display device functions as a capacitor. When a voltage is applied across the electrodes, the phosphor material is activated and emits light.

Phosphors may be employed in the manufacture of electroluminescent devices. Long-lasting phosphors are known in the art, and include sulfides and oxides. Many long-lasting phosphor products are those with a sulfide as their base crystal, such as ZnS:Cu. Phosphorescence characteristics are influenced by composition, particle diameter, and environment, in particular, the phosphorescence brightness of phosphors.

Other light-emitting materials, such as certain small molecules and certain polymers, may also be employed in the manufacture of electroluminescent devices. Suitable light-emitting small molecules include quinolines, fluorescein, and the like.

Light-emitting polymers (LEPs) may further be employed in the manufacture of electroluminescent devices. Suitable light-emitting polymers include MEHPPV (2-methoxy-5-2'-ethylhexyloxy)-1,4-phenylenevinylene copolymer, MEH-BP-PPV (poly[2-Methoxy-5-(2'-ethylhexyloxy)-1,4-phenylenevinylene-co-4,4'-bisphenylenevinylene]), and MEH-CN-PPV (poly[2-methoxy-5-(2'-ethylhexyloxy)-1-(cyanovinylene)phenylene). These LEPs absorb radiation at about 400 to about 500 nm (blue light) and emit radiation at about 600 and 800 nm (yellow, orange, and red light).

The short lifetime of organic light-emitting polymers (LEPs) has been a major impediment to their use in commercial environments. Organic LEPs are unstable when exposed to air and humidity. In addition to oxygen, other contaminants present in air, such as ozone and $NH_3$, also adversely affect the useful lifetime of LEPs.

Heretofore, lamps fabricated from LEPs have been entirely encapsulated, or have had exposed surfaces coated with protective layers to achieve stability. This large-scale encapsulation/coating process is costly, and requires the use of a relatively expensive transparent material.

Another characteristic of phosphor materials is that the selection of wavelengths of emissive radiation that could be obtained from phosphors that were excitable by a simple electric field was substantially limited to blues, greens and oranges—depending upon the dopant that was used in the phosphor. Radiation of other wavelengths could be obtained from different phosphors, but those phosphors required high-energy photons or an electron beam for excitation. Accordingly, effective provision of electroluminescent radiation having wavelength of a desired spectra—other than blue, green or orange—was difficult to achieve.

It would be useful, therefore, to provide an electroluminescent device capable of emitting radiation at a desired wavelength that was other than blue, green, or orange, but which was powered by an electric field. It would also be useful if the electric field could be supplied by an alternating current source. Furthermore, it would be useful if the electroluminescent device could be produced simply and easily, and without the use of inert atmospheres, high vacuum, sputtering, or the use of electrodes composed of low-work function metals, such as calcium, aluminum, sodium and magnesium, or their oxides.

SUMMARY OF THE INVENTION

Briefly, therefore the present invention is directed to a novel luminescent device comprising an electroluminescent phosphor in operative contact with a light-emitting material wherein excitation of the electroluminescent phosphor by an alternating current electrical field causes the emission of light by the light-emitting material.

The present invention is also directed to a novel method of making an electroluminescent device comprising the steps: placing a phosphor and an insulating layer between a first electrode and a second electrode; and placing a light-emitting material in operative contact with the phosphor.

The present invention is also directed to a novel electroluminescent display comprising an electroluminescent phosphor in operative contact with a light-emitting material wherein excitation of the electroluminescent phosphor by an alternating current electrical field causes the emission of light by the light-emitting material; and a first electrode and a second electrode, between which is located the electroluminescent phosphor and an insulating layer.

Among the several advantages found to be achieved by the present invention, therefore, may be noted the provision of an electroluminescent device capable of emitting radiation at desired wavelengths that are in addition to blue, green, or orange, but which is powered by an electric field; the provision of an electroluminescent device where the electric field can be supplied by an alternating current source; and the provision of an electroluminescent device which can be produced simply and easily, and without the use of inert atmospheres, high vacuum, sputtering, or the use of electrodes composed of low-work function metals, such as calcium, aluminum, sodium and magnesium, or their oxides.

BRIEF DESCRIPTION OF THE DRAWINGS

Corresponding reference characters indicate corresponding part thought the several views of the drawings.

DETAILED DESCRIPTION OF THE PREFERRED EMBODIMENTS

Figure 1:
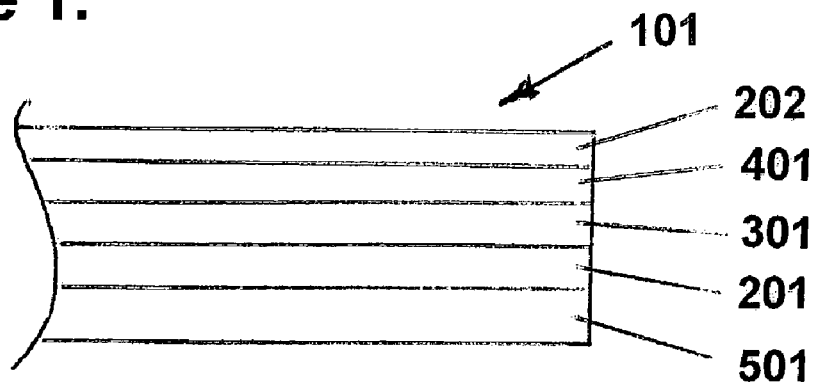
FIG. 1 is an illustration of an electroluminescent device having a substrate, a first electrode, a phosphor layer, a layer of a light-emitting material, and a second electrode.

In accordance with the present invention, it has been discovered that a luminescent device can be constructed that comprises an electroluminescent phosphor in operative contact with a light-emitting material, wherein excitation of the electroluminescent material by an alternating current electrical field causes the emission of light by the light-emitting material. In one embodiment, an electrode, which can be composed of poly(3,4-ethylenedioxythiophene) (PEDOT), for example, can be applied to a substrate, such as a plastic film, or a fabric. Particles of a phosphor, such as copper-doped zinc sulfide (ZnS:Cu), can be coated with a light-emitting material, such as poly[2-methoxy-5-(2'-ethyl)hexoxy-1,4-phenylenevinylene] (MEHPPV), and the coated particles can be compounded with a binder polymer into a UV-curable ink. The ink easily can be applied to the electrode-coated substrate to form a light-emitting layer by conventional methods such as screen-printing, or ink-jet printing, for example. The cured ink layer acts as an electrically insulating layer that contains the coated phosphor particles. A second electrode, which can be transparent to the radiation emitted by the light-emitting material, and which can also be composed of poly(3,4-ethylenedioxythiophene), is then applied over the cured ink layer. If desired, layers of dielectric materials can be added between the electrodes, or protective layers can be used to coat the display. Application of an AC electrical field across the two electrodes causes excitation of the electroluminescent phosphor, which, in turn, transfers energy to the light-emitting material, which emits radiation from the device.

The novel device has a number of advantageous features that include the ability to provide luminescent light of a desired frequency by supplying only an AC electric field. In other words, the device provides a way to excite luminescent materials that emit radiant energy at a desired wavelength, but which are not normally excitable by an electric field. Heretofore, electroluminescent materials, such as ZnS:Cu, ZnS:Mn, or ZnS:Ag, or the like, have provided a limited choice as to the colors of light emitted. If other colors are required, one had to resort to materials that required methods of excitation other than a simple AC electric field. Such methods included photoexcitation by laser, collimated light, etc., or cathodoexcitation, by bombardment with a beam of electrons. Now it has been discovered that by judicious selection of materials, initial excitation of an electroluminescent phosphor can be obtained by imposing an AC field, and radiant energy of almost any desired wavelength—from UV, to visible, to IR—can be produced. This has been achieved by coupling the phosphor with a separate light-emitting material. In an alternative embodiment, the device can employ one or more intermediate energy-transfer materials that transfer energy between the electroluminescent phosphor and the light-emitting material. Each intermediate layer, in turn, being excited by a luminescent material that is either emitting radiant energy of a particular wavelength or transferring energy by another mechanism, and then radiating energy itself at a wavelength that excites a separate luminescent material. The combination of luminescent materials forms a cascade of energy transfer, starting with excitation with an AC electric field and ending with emission of radiant energy of a desired wavelength by a light-emitting material.

An additional advantage of the present device is that is it easily fabricated by inexpensive and conventional means, such as, for example, screen printing, ink jet printing, or the like. The devices require no low-work function electrode materials, such as calcium, aluminum, sodium, or magnesium, or the oxides thereof, and, therefore, are less susceptible to corrosion than conventional devices that include these metals. Moreover, the present devices do not require expensive fabrication techniques such as vacuum fabrication, vapor deposition, or sputtering. Fabrication of the present devices can occur entirely at ambient conditions and without the provision of special atmospheres.

Furthermore, due to the structure and the materials that can be used in the present devices, there is no need to encase the devices in glass to protect their stability. Such simple fabrication techniques result in electroluminescent devices having a greater range of colors, which can be produced at lower cost, and which can be applied over larger areas by conventional printing techniques.

One element of the present device is an electroluminescent phosphor. Any solid material that is electroluminescent—that is, can emit radiation after excitation by an alternating current (AC) electrical field—can serve as the electroluminescent phosphor of the present invention. In the present invention, the electroluminescent phosphor is capable of emitting radiation at a first wavelength.

As used herein, the terms "radiation" and "light" can be used interchangeably, and include ultraviolet, visible, and infrared radiation.

As used herein, when it is said that a material emits light at a particular wavelength, it should be understood that some luminescent materials can emit light at several different wavelengths, and what is meant is the principle or peak wavelength of the radiation emitted by the material. The wavelength of radiation can also be referred to in terms of its frequency, and each of the two terms would be recognized by a skilled artisan as being related to the other and interconvertable.

Electroluminescent phosphor materials can be inorganic solids or organic materials. Inorganic solid phosphors are preferred.

Examples of electroluminescent phosphors that are useful in the present invention include CdSe; InAs; LaPO$_4$, undoped or doped with one or more of Pr, Nd, Er, or Yb; YOS, undoped or doped with Er; ZnS, undoped, or doped with Ag, Cu, Mn, Tb, TbF, TbF$_3$; ZnSe, undoped or doped with Cu or Mn; undoped or doped ZnCdS; compounds that can be expressed as $M^{IIA}M_2^{III}(S, Se)_4$, where $M^{IIA}$=Ca, Sr or Ba and $M^{III}$=Al, Ga, In, or Y, undoped, or doped with $Eu^{2+}$ or $Ce^{3+}$; and mixtures of any two or more of these materials. When a phosphor is doped with a material, the doped phosphor can be expressed as: (the name of the phosphor molecule:the dopant). By way of example, copper-doped zinc sulfide can be expressed as ZnS:Cu.

Commercially available phosphors, such as, for example, phosphors "830", "TNE", and "GGS" (all available from Sylvania Co.) are suitable for use in the present invention.

Any of the electroluminescent phosphor materials that are described in such publications as: (1) *Phosphor Handbook*, Shionoya, S. and W. M. Yen, Eds. CRC Press, Boca Raton, Fla. (1999); (2) Hebbink, G. A., et al., *Adv. Mater,* 14(16): 1147-1150 (2002); (3) Gumlich, H.-E. et al., *Electroluminescence,* Chap. 6, pp. 221-269, in *Luminescence of Solids,* D. R. Vij, Ed., Plenum Press, New York, (1998); (4) Suyver, J. F. et al., *Photochemistry of layers of ZnS:Mn2+ nanocrystals,* in *Proceedings of the 2$^{nd}$ International Symposium on Advanced Luminescent Materials and Quantum Confinement,* 201$^{st}$ Meeting of the Electrochemical Society, 175 (2002); and (4) in other publications by Suyver, listed at http://www.phys.uu.nl/~suyver/Publications (Nov. 27, 2002), can be used as the electroluminescent phosphor of the present invention. Additional information about useful phosphors and methods of preparing electroluminescent phosphor materials can be found in U.S. Pat. Nos. 5,598,058, 5,602,445, 5,711,898, 5,702,643, 5,700,592, 5,700,591, 5,677,594, 5,675,217, 5,643,496, 5,635,110, 5,612,591, 5,598,059, 5,593,782, 5,554,449, 5,543,237, 5,309,071, and 5,309,070.

Some inorganic electroluminescent phosphors can be purchased commercially from such sources as Phosphor Technology, Ltd., Essex, England; South Bank University, London, England; and Osram Sylvania, Danvers, Mass.; among others.

The electroluminescent phosphor can be used in the present device in any physical form, but it is preferred that the phosphor is a solid material. The phosphor can have any physical shape, but particles are preferred. The particles can be roughly spherical, or they can be irregular. The particles can be of any size. It is preferred, however, that the particles are sufficiently large to preserve the crystalline fine structure necessary for luminescent activity. When the size of a phosphor particle is described herein, it should be understood that it is the nominal size (average diameter of a roughly spherical particle) that is being described. Accordingly, the terms "10 micron particles" would be interpreted to be a number of roughly spherical solid particles having a number average diameter of 10 microns.

In an embodiment of the present device, the phosphor particles have an average nominal size of from about 0.05 microns to about 50 microns, and preferably, have an average nominal size of from about 10 microns to about 40 microns. When it is desirable to use the particle size of the phosphor particles as a parameter for controlling the wavelength of the radiation emitted from the phosphor, the preferred size range of the particles is from about 0.1 to about 10 nm, and more preferably, from about 0.5 nm to about 5 nm, and yet more preferably, from about 1 nm to about 3 nm.

Some commercially produced electroluminescent phosphor particles are coated with a protective coating of, for example, aluminum nitride, or silicon oxide. The particles can be used in the present invention whether or not such coatings are present.

In the present device, the electroluminescent phosphor is in operable contact with a light-emitting material. The light-emitting material of the present device can be any material which is excited when in operative contact with the excited electroluminescent phosphor and which is capable of emitting light of a wavelength that is different than the light emitted by the electroluminescent phosphor.

In an embodiment of the present invention, the light-emitting material is an inorganic solid. Examples of such materials include LaPO$_4$, undoped or doped with one or more of Pr, Nd, Er, or Yb (See, e.g., the description of such near IR-emitting materials by Hebbink, G. A., et al., in *Adv. Mater,* 14(16):1147-1150 (2002)). YOS, undoped or doped with Er. Inorganic light emitting materials can also include compounds having the description: $M^{IIA}M_2^{III}(S, Se)_4$, where $M^{IIA}$=Ca, Sr or Ba, and $M^{III}$=Al, Ga, In, Y, or is optionally absent, and the compounds can be undoped, or doped with $Eu^{2+}$ or $Ce^{3+}$. Mixtures of such materials can also be used.

In a preferred embodiment of the present invention, the light-emitting material is an organic material. Examples of organic materials that are useful as the light-emitting material in the present device include: antracene, undoped or doped with tetracene; aluminum tris(8-hydroxyquinolinate); poly-(p-phenylenevinylene) (PPV); poly[2-methoxy-5-(2'-ethyl)hexoxy-1,4-phenylenevinylene] (MEHPPV); poly[2-methoxy-5-(2'-ethylhexyloxy)-1,4-phenylenevinylene-co-4, 4'-bisphenylenevinylene] (MEH-BP-PPV), poly[2-methoxy-5-(2'-ethylhexyloxy)-1-(cyanovinylene)phenylene (MEH-CN-PPV), poly[1,3-propanedioxy-1,4-phenylene-1, 2-ethylene-(2,5-bis(trimethylsilyl)-1,4-phenylene)-1,2-ethylene-1,4-phenylene] (DiSiPV); Tb tris(acetylacetonate); Eu(1,10-phenanthroline)-tris(4,4,4-trifluoro-1-(2-thienyl) butane-1,3-dionate; Eu tris(dibenzoylmethanato)phenanthroline; Tb tris(acetylacetonate)phenthroline; Eu(4,7-diphenyl phenanthroline)-tris(4,4,4-trifluoro)-1-(2-thienyl)-butane-1,3-dionate; Nd(4,7-diphenylphenanthroline) (dibenzoylmethanato)$_3$; Eu(dibenzolmethanato)$_3$-2-(2- pyridyl)benzimidazole; Eu(dibenzolmethanato)$_2$-1-ethyl-2-(2-pyridyl)benzimidazole; Tb-[3-(5-phenyl-1,3,4-oxadiazol-2-yl)-2,4-pentanedionate]$_3$; lanthanide-tris(4-methylbenzoate); lanthanide-tris(4-methoxybenzoate); Tb-tris(4-methylbenzoate); Tb tris(4-methoxybenzoylbenzoate); Eu tris(4-methoxybenzoylbenzoate); Tb-tris(tetradecylphethalate)phenantroline; Tb-imidodiphosphinate; Tb 1-phenyl-3-methyl-4-(trimethylacetyl)pyrazol-4-one; polypyridine; poly(p-phenylenevinylene); poly[2-methoxy-5-(2'-ethylhexyloxy)-1,4-phenylenevinylene]; poly[2-methoxy-5-(2-ethylhexyloxy)-1,4-phenylene-vinylene]; poly[(2-methoxy-5-(2-ethylhexyloxy)-1,4-phenylene-vinylene)-alt-co-(4,4'-biphenylene-vinylene)]; poly[(9,9-dioctyl-2,7-divinylenefluorenylene)-alt-co-(9,10-anthracene)]; poly[(9,9-dioctyl-2,7-divinylenefluorenylene)-alt-co-(4,4'-biphenylene)]; poly[{9,9-dioctyl-2,7-divinylenefluorenylene}-alt-co-{2-methoxy-5-(2-ethyl-hexyloxy)-1,4-phenylene}]; poly[{9,9-dioctyl-2,7-bis(2-cyanovinylenefluorenylene}-alt-co-{2-methoxy-5-(2-ethylhexyloxy)-1,4-phenylene}]; poly[2-methoxy-5-(2-ethylhexyloxy)-1,4-(1-cyanovinylenephenylene)]; poly[{9,9-dihexyl-2,7-bis(1-cyanovinylene)fluorenylene}-alt-co-{2,5-bis(N,N'-diphenylamino)-1,4-phenylene}]; poly[{9-ethyl-3,6-bis(2-cyanovinylene)carbazolylene)}-alt-co-{2-methoxy-5-(2-ethylhexyloxy)-1,4-phenylene}]; poly[(9,9-di(2-ethylhexyl)-fluorenyl-2,7-diyl)-co-(N,N'-diphenyl)-N,N'-di-(p-butyl phenyl)-1,4-diaminobenzene]; poly[2-(6-cyano-6-methylheptyloxy)-1,4-phenylene); poly[{9,9-dioctylfluorenyl-2,7-diyl}-co-{1,4-(2,5-dimethoxy) benzene}]; poly[{9,9-dioctylfluorenyl-2,7-diyl}-co-{1,4-(2, 5-dimethoxy)benzene}]; poly[(9,9-dioctylfluorenyl-2,7-diyl)-co-(1,4-ethylenylbenzene)]; poly[(9,9-dioctylfluorenyl-2,7-diyl)-co-(1,4-diphenylene-vinylene-2-methoxy-5-{2-ethylhexyloxy}-benzene)]; poly[(9,9-dihexylfluorenyl-2,7-divinylenefluorenylene)]; poly[(9,9-dihexyl-2,7-(2-cyanodivinylene)-fluorenylene)]; poly[(9,9-dioctylfluorenyl-2,7-diyl)-co-(1,4-vinylenephenylene)]; poly[(9,9-dioctylfluorenyl-2,7-diyl)-co-(1,4-vinylenephenylene)]; poly(9,9-dioctylfluorenyl-2,7-diyl; poly(9,9-dihexylfluorenyl-2,7-diyl); poly[9,9-di-(2-ethylhexyl)-fluorenyl-2,7-diyl]; poly[(9,9-dioctylfluorenyl-2,7-diyl)-co-(N,N'-diphenyl)-N,N'-di(p-butyloxyphenyl)-1,4-diaminobenzene)]; poly[(9,9-dioctylfluorenyl-2,7-diyl)-alt-co-(N,N'-diphenyl)-N,N'-di(p-butyloxy-phenyl)-1,4-diaminobenzene)]; poly[(9,9-dihexylfluorenyl-2,7-diyl)-co-(1,4-benzo-{2,1',3}-thiadiazole)]; poly[(9,9-dihexylfluorenyl-2,7-diyl)-alt-co-(9,10-anthracene)]; poly[(9,9-dioctylfluorenyl-2,7-diyl)-alt-co-(N,N'-bis{4-butylphenyl}-benzidine-N,N'-{1,4-diphenylene})]; poly[(9, 9-dihexylfluorenyl-2,7-diyl)-alt-co-(2-methoxy-5-{2-ethylhexyloxy}-1,4-phenylene)]; poly[(9,9-dihexylfluorenyl-2,7-diyl)-co-(9,ethyl-3,6-carbazole)]; poly[(9,9-dihexylfluorenyl-2,7-diyl)-alt-co-(9,ethyl-3,6-carbazole)]; poly[(9,9-dihexylfluorenyl-2,7-diyl)-alt-co-(9, 9'-spirobifluorene-2,7-diyl]; poly[(9,9-dihexylfluorenyl-2,7-diyl)-co-(2,5-p-xylene)]; poly[(9,9-dihexylfluorenyl-2,7-diyl)-co-(3,5-pyridine)]; poly[(9,9-dihexylfluorenyl-2,7-diyl)-co-(1,4-phenylene)]; poly[(9,9-dihexylfluorenyl-2,7-diyl)-alt-co-(9,9-di-{5-pentanyl}-fluorenyl-2',7'-diyl; poly [(9,9-dihexylfluorenyl-2,7-diyl)-co-(6,6'{2,2'-bipyridine})]; poly[(9,9-dihexylfluorenyl-2,7-diyl)-co-(6,6'-{2,2':6',2"-terpyridine})]; poly[(9,9-dihexylfluorenyl-2,7-diyl)-co-(N, N'bis{p-butylphenyl}-1,4-diamino phenylene)]; 8-hydroxyquinoline; fluorescein; rhodamine; xanthene, substituted or unsubstituted coumarin; substituted hydroxy-coumarin; substituted or unsubstituted tetra-cyanoquinolines; ethidium bromide; propidium iodide; benzoxanthene yellow; bixbenzimide ((2'-[4-hydroxyphenyl]-5-[4-methyl-1-piperazinyl]-2,5'-bi-1H-benzimidazol); (2'-[4-ethoxyphenyl]-5-[4-methyl-1-piperazinyl]-2,5'-bi-1H-benzimidazol)); 4,6-diamidino-2-phenylindole (DAPI); lithium tetra(2-methyl-8-hydroxyquinolinato)boron; bis(8-hydroxyquinolinato)zinc; tris(benzoylacetonato)mono(phenanthroline)europium(III); tris(2-phenylpyridine)iridium(III); and tris(8-hydroxyquinolinato)gallium(III); tris(8-hydroxyquinolato) aluminum; tetra(2-methyl-8-hydroxyquinolato)boron; lithium salt; 4,4'-bis(9-ethyl-3-carbazovinylene)-1,1'-biphenyl; 9,10-di[(9-ethyl-3-carbazoyl)-vinylenyl)]-anthracene; 4,4'-bis(diphenylvinylenyl)-biphenyl; 1,4-bis(9-ethyl-3-carbazovinylene)-2-methoxy-5-(2-ethylhexyloxy)benzene; tris (benzoylacetonato)mono(phenanthroline)europium(III); tris (dibenzoylmethane)mono(phenanthroline)europium(III); tris(dibenzoylmethane)mono(5-aminophenanthroline)europium(III); tris(dinapthoylmethane)mono(phenanthroline) europium(III); tris(biphenoylmethane)mono(phenanthroline)europium(III); tris(dibenzoylmethane)mono(4,7-diphenylphenanthroline)europium(III); tris (dibenzoylmethane)mono(4,7-dimethyl-phenanthroline) europium(III); tris(dibenzoylmethane)mono(4,7-dihydroxy-phenanthroline)europium(III); tris(dibenzoylmethane)mono (4,7-dihydroxyloxy-phenanthroline)europium(III); lithium tetra(8-hydroxyquinolinato)boron; 4,4'-bis(9-ethyl-3-carbazovinylene)-1,1'-biphenyl; bis(8-hydroxyquinolinato)zinc; bis(2-methyl-8-hydroxyquinolinato)zinc; iridium(III) tris(2-phenylpyridine); tris(8-hydroxyquinoline)aluminum; and tris[1-phenyl-3-methyl-4-(2,2-dimethylpropan-1-oyl)-pyrazolin-5-one]-terbium. Mixtures of two or more of any of these organic light-emitting materials can also be used.

The light-emitting material of the present invention may be synthesized, or may be purchased from commercial suppliers, one of which is American Dye Source, Quebec, Canada, Further information on the synthesis and use of lanthanide complexes can be found in Kido, J. et al., *Chem. Rev.* 102:2357-2368 (2002). Further information on organic light emitting materials that emit in the infrared region, which are useful in the present invention, can be found in U.S. Patent Publication US2001/0030325 A1.

In an embodiment of the present invention the light-emitting material is one that is not excited by an alternating current electrical field.

In the present device, the electroluminescent phosphor is in operative contact with the light-emitting material. By the terms "operative contact", what is meant is that the position in the device of the electroluminescent phosphor relative to the light-emitting material is such that a transfer of energy from the excited phosphor to the light-emitting material is possible that is sufficient to raise the light-emitting material to an excited state that results in the emission of radiation from the light-emitting material. In one embodiment, operative contact is direct physical contact between the phosphor and the light-emitting material. In an alternative embodiment, operative contact is close proximity of the phosphor to the light-emitting material when both are in the same layer. In another embodiment, operative contact is the presence of the phosphor in one layer and the presence of the light-emitting material in another layer of the device where the two layers are adjacent, or are separated only by a layer or layers that permit the energy transfer from the phosphor to the light-emitting material.

A useful feature of the present device is that it can be produced by conventional fabrication methods that do not require unusual techniques or atmospheres. With reference to the figures that are attached hereto, one embodiment of the electroluminescent device (101) can be constructed as shown in FIG. 1, by applying a first electrode (201) to a substrate (501). Almost any material to which an electrode can be applied can be used as the substrate in the present device. An advantageous feature of the present invention is that the substrate can be a flexible material, such as a plastic film or a woven or non-woven textile material. It is preferred that the substrate is an electrically insulating material. However, the substrate may be a metal, which could serve as one electrode.

The first electrode (201) is an electrically conductive material. It is preferred that the first electrode is composed of a material that can be applied to the substrate by conventional coating or printing methods, such as by screen printing, ink jet printing, or the like. In some embodiments, it is preferred that the first electrode is free of metals and metal oxides. As used herein when describing electrodes, the term "metals" is to be understood to include high work function metals, such as indium and titanium, as well as lower work function metals, such as calcium, aluminum, and magnesium.

In preferred embodiments, the first electrode (201) is composed of an intrinsically conductive polymer (ICP). The terms "intrinsically conductive polymer", or "ICP", as used herein, are intended to include any polymer that, in at least one valence state, has an electrical conductivity greater than about $10^{-8}$ S/cm and preferably greater than about $10^{-6}$ S/cm. ICP's generally have polyconjugated .pi. electron systems and can be doped with an ionic dopant species to an electrically conductive state. A number of conjugated organic polymers that are suitable for this purpose are known in the art and include, for example, polyaniline, polyacetylene, poly-p-phenylene, poly-m-phenylene, polyphenylene sulfide, polypyrrole, polythiophene, polycarbazole and the like, which can be substituted or unsubstituted. Such ICP's are well known and those of ordinary skill in the art will readily recognize those ICP's that are within the scope of this invention.

In preferred embodiments, the first electrode is constructed of poly(3,4-ethylenedioxythiophene) doped with polystyrenesulfonic acid (PEDOT/PSSA, available from Agfa-Gevaert, Mortsel, Belgium). PEDOT/PSSA is a water soluble polymer and can be applied to the substrate in the form of an aqueous solution. The aqueous solution of PEDOT/PSSA can be applied to the substrate by any conventional technique, including, for example, rolling, brushing, spraying, dipping, spin-coating, screen printing, jet printing, and the like.

An electroluminescent phosphor (301) can be applied over the first electrode (201). Any one of the electroluminescent phosphor materials described above can be used.

A light-emitting material (401) can then be applied over the electroluminescent phosphor.

Finally, a second electrode (202) can be applied over the light-emitting material (401). The second electrode (202) can be any material that is suitable for use as an electrode. Intrinsically conductive polymers are preferred for use as the second electrode. It is preferred that the second electrode is constructed of a material that is transparent to the radiation emitted by the light-emitting material in order for that radiation to exit the electroluminescent device (101). In preferred embodiments, the second electrode is free of a metal or metal oxide. In more preferred embodiments, the second electrode (202) is constructed of the same material as the first electrode (201). One example of a material that is preferred for use in both the first electrode (201) and the second electrode (202) is poly(3,4-ethylenedioxythiophene) (PEDOT). The PEDOT can be doped with polystyrenesulfonic acid (PSSA).

Figure 2:
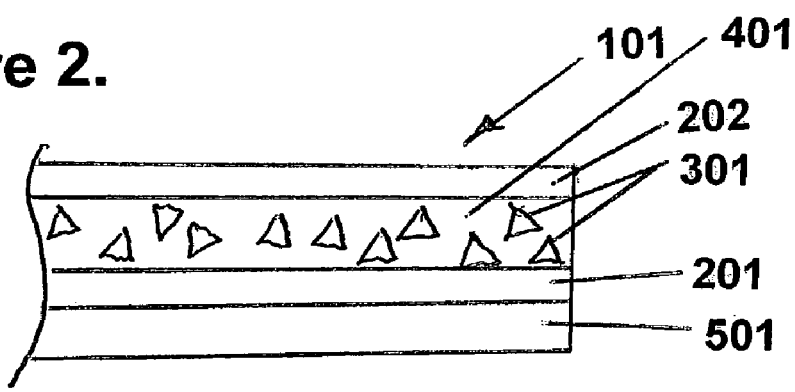
FIG. 2 is an illustration of an electroluminescent device having a substrate, a first electrode, phosphor particles dispersed in a layer of a light-emitting material, and a second electrode.

In an alternate embodiment, shown in FIG. 2, the electroluminescent device (101) can be constructed as described above, except that the electroluminescent phosphor (301) can be present in the form of particles, and the particles can be embedded within, or distributed within, the light-emitting material (401), which can act as a matrix for the electroluminescent phosphor particles.

In the embodiments of the device shown in both FIG. 1 and FIG. 2 it is preferred that the layers that include the electroluminescent phosphor (301) and light-emitting material (401), of the device of FIG. 1, and the layer containing the electroluminescent phosphor (301) and light-emitting material (401), of the device of FIG. 2, (i.e., the layers between the first and the second electrodes), be electrically non-conductive. This is believed to facilitate the establishment of an electrical field across the two electrodes when an alternating current (AC) is charged to the electrodes.

Figure 3:
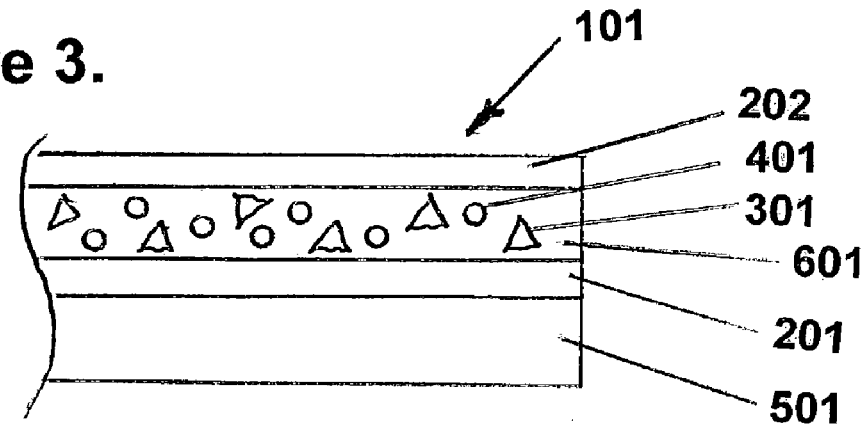
FIG. 3 is an illustration of an electroluminescent device having a substrate, a first electrode, phosphor particles and particles of a light-emitting material embedded in a dielectric and a second electrode.

In an alternative embodiment, shown in FIG. 3, both the electroluminescent phosphor (301) and the light-emitting material (401) can be in particulate form and both can be dispersed within a binder (601). In this case, the binder is preferably an electrically non-conducting material. In the embodiment shown in FIG. 3, the light-emitting material (401) can be present either as very small particles distributed through the binder material (601), or even dissolved in the binder material.

It should be understood that the depiction of particles in any of the drawings is not meant to limit or represent the size or shape of any particle, or the relative size or shape of any particle with respect to another type of particle.

Suitable binder materials can be any suitable thermoplastic, including poly(vinylbutyral), poly(vinylalcohol), poly(vinylchloride), polycarbonate, polystyrene, poly(vinylidene chloride), poly(vinylidene fluoride), poly(vinylidenedifluoride), poly(acrylonitrile), poly(oxyethylene), cellulose esters, cellulose ethers, nylon 6,6, nylon 12, nylon 6,12, poly(ethylene oxide), poly(ethylene-co-vinylacetate), poly(vinylcarbazole), poly(caprolactone), polysulfone, poly(vinylpyrrolidone), poly(4-vinylphenol), poly(methyloctadecylsiloxane), and the like. A preferred binder is poly(vinylidenedifluoride) (PVDF).

Other binder systems that may be employed include systems employing thermosetting resins, for example, systems with urethane and epoxies, as well as UV-curable binder systems.

The binder polymer can be put into solution with, or dispersed into, a solvent. Light-emitting particles (103), binder polymer, and solvent can be formulated into an ink, which can be applied by any conventional printing process. In preferred embodiments, the binder polymer and solvent are selected so that the light-emitting material is insoluble, or has limited solubility, in the binder/solvent. By the term "insoluble", it is meant that the light-emitting material has a solubility of less than about 10 mg/l at room temperature. It is preferred that the light-emitting material has a solubility in the binder/solvent system of less than about 1 mg/l. When it is said that the light-emitting material has limited solubility in the binder/solvent system, what is meant is that the light-emitting material is soluble in the binder/solvent system at room temperature of less than about 0.5% by weight. It is preferred that a light-emitting material having limited solubility is soluble in the binder/solvent system at room temperature of less than about 0.1% by weight One preferred embodiment is the dispersal of MEHPPV-coated ZnS:Cu phophor particles into poly(methylmethacrylate) or poly(butylmethacrylate) in a suitable solvent. Some examples of suitable solvents include tetrahydrofuran (THF), xylene, terpinol mixed isomers (TERP), ethyldiglycol acetate (EDGA), dichloroethane (DCE), and the like, and mixtures thereof.

A preferred binder system includes a UV-curable polymer-forming system in a liquid that can be applied by a conventional printing system, such as, for example, a screen-printing system. An example of such a preferred binder is the ink that includes a UV curable urethane acrylate/acrylate monomer blend of proprietary composition, designated FD 3007 CL, available from Allied Photochemical Inc., Kimball, Mich. This type of ink can be applied by screen printing and cured by exposure to UV illumination.

Another example of a UV-curable binder system that is useful is available from DuPont, Wilmington, Del., and is identified as Product Number 5018A.

For the description of other UV curable binder systems that are useful in the present invention, see http://www.sartomer.com/wpapers/3300.

Figure 4:
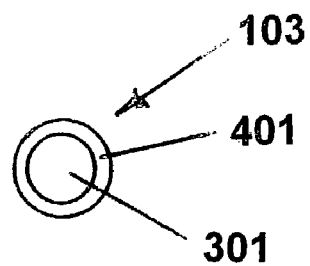
FIG. 4 is an illustration of a phosphor particle coated with a light-emitting material to make a light-emitting particle.

In another embodiment, the light-emitting material (401) can be in direct contact with the electroluminescent phosphor (301). In a preferred embodiment, shown in FIG. 4, the electroluminescent phosphor (301) is coated with the light-emitting material (401), to form a light-emitting particle (103). As discussed above, the light-emitting particle (103) can optionally have a thin coating of a protective material, such as aluminum nitride or silicon oxide, between the phosphor particle (301) and the light-emitting material coating (401).

Figure 5:
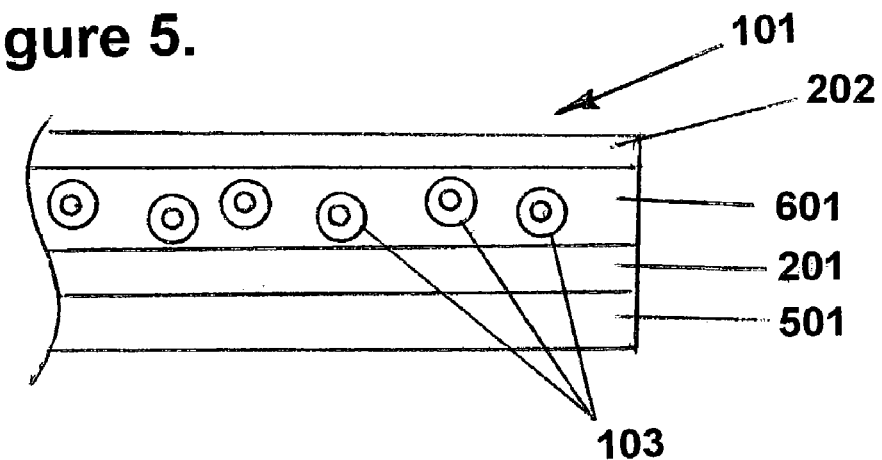
FIG. 5 is an illustration of an electroluminescent device having a substrate, a first electrode, light-emitting particles dispersed in a dielectric, and a second electrode.

The light emitting particles (103) can be used in an embodiment of the present device, an example of which is shown in FIG. 5. In this embodiment, a first electrode (201) is applied to a substrate (501), as described above. A layer comprising the light-emitting particles (103) distributed in a binder (601) is then applied over the first electrode. The layer containing the binder (601) and the light-emitting particles (103) can be referred to as the light emitting layer. Next, a second electrode (202) is applied to the cured binder/light-emitting particle layer.

Figure 6:
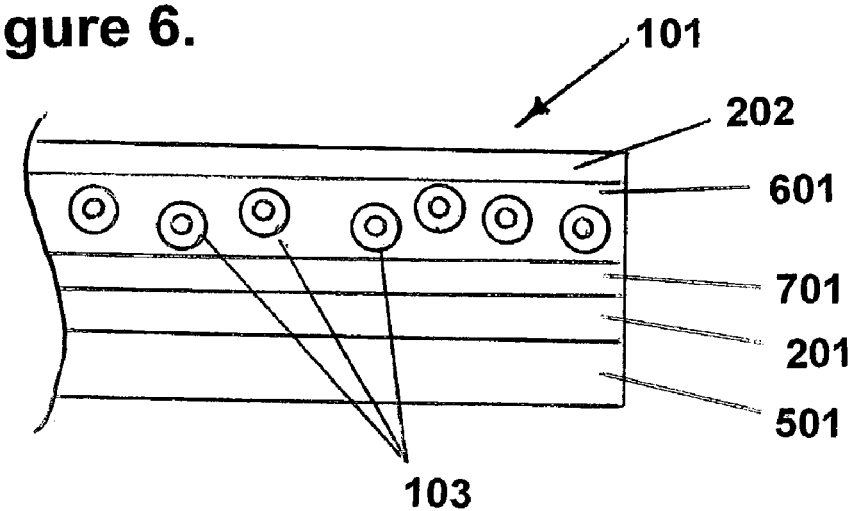
FIG. 6 is an illustration of an electroluminescent device having a substrate, a first electrode, a dielectric layer, a layer composed of light-emitting particles dispersed in a dielectric, and a second electrode.

In an optional embodiment, shown in FIG. 6, a layer of a dielectric material (701), such as, for example, barium titanate, can be used in the device. A preferred location for the dielectric layer (701) is between the first electrode (201) and the light-emitting layer. An advantage of the use of a dielectric layer at this location is that it facilitates the formation of a suitable electric field across the light emitting layer upon the application of an AC current across the two electrodes. Such dielectric layer can also be added to the configurations of the device shown in FIG. 1, FIG. 2, and FIG. 3, with the same advantageous effect.

Figure 7:
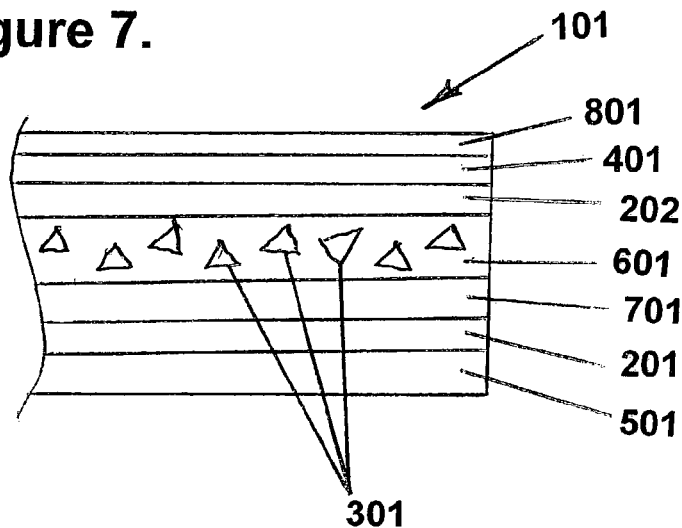
FIG. 7 is an illustration of an electroluminescent device having a substrate, a first electrode, a dielectric layer, a layer composed of phosphor particles dispersed in a dielectric, a second electrode, a layer composed of a light-emitting material, and a protective layer.

In FIG. 7, an alternative embodiment of the electroluminescent device (101) is constructed by the application of a first electrode (201) onto a substrate (501) as described above. A layer of dielectric material (701) may be applied over the first electrode, and the dielectric layer can be followed by the application of a binder layer (601) in which phosphor particles (301) are embedded. The binder/phosphor layer can be topped with a second electrode (202), which is preferably composed of a material that is transparent to the radiant energy emitted by the phosphor (301). A layer containing a light-emitting material (401) can be applied over the second electrode, and this can be covered with a protective layer (801), which can be a protective polymer, glass, or the like. It is noteworthy that in this embodiment, the phosphor and the light-emitting material are separated by the second electrode.

Figure 8:
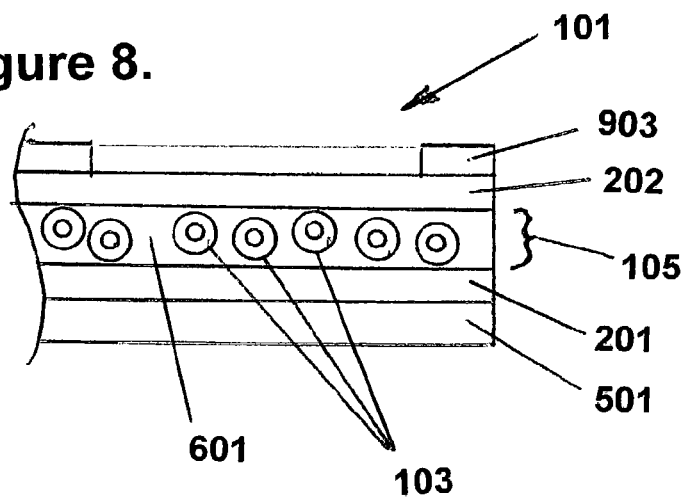
FIG. 8 is an illustration of an electroluminescent device having a substrate, a first electrode, a light-emitting layer composed of light-emitting particles dispersed in a dielectric, a second electrode, and a front outlining electrode.

FIG. 8 is an illustration of an electroluminescent device having a substrate (501), a first electrode (201), a light-emitting layer (105) composed of light-emitting particles (103) dispersed in a dielectric (601), a second electrode (202), and a front outlining electrode (903).

Figure 9:
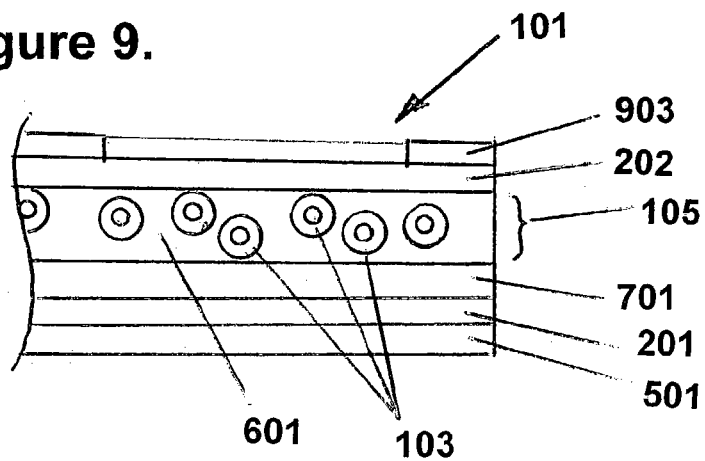
FIG. 9 is an illustration of electroluminescent device having a substrate, a first electrode, a dielectric layer, a light-emitting layer composed of light-emitting particles dispersed in a dielectric, a second electrode, and a front outlining electrode.

FIG. 9 is an illustration of electroluminescent device having a substrate (501), a first electrode (201), a dielectric layer (701), a light-emitting layer (105) composed of light-emitting particles (103) dispersed in a dielectric (601), a second electrode (202), and a front outlining electrode (903).

FIGS. 10(a) and (b) illustrate the use of any one of the electroluminescent devices of FIGS. 1, 2, 3, 5, 6, 7 or 8 in an alternating current electrical system. Here, a first lead (901) of the AC circuit is connected to the first electrode (201), and a second lead (902) is connected to the second electrode (202). The leads can be made of any material that will conduct an electric current, but the use of a metal, such as silver, is preferred. The use of the device to display a specific illuminated area, here the letter "A", is illustrated in FIG. 10(b).

When a source of alternating current of the proper voltage and amperage is applied to the first lead (901) and the second lead (902), the resulting electric field causes excitation of the phosphor (301), which, in turn, causes excitation of the light-emitting material (401), which emits radiation from the device.

If desirable, other system components, such as timing devices, switches, and the like can be added to the electrical system to control the operation of the electroluminescent device. By way of example, the device can be made to turn on and off, to blink, to fade and/or brighten, and the like.

When the present electroluminescent device is produced, certain relative amounts of the phosphor (301), the light-emitting material (401), and the binder (601)—when a binder is used—have been found to be useful. It has been found that a preferred ratio of the amount by weight of the light-emitting material (401) to the weight of the phosphor (301) is within a range of from about $1 \times 10^{-6}:1$ to about 1:1, more preferred is a ratio of from about 0.00001:1 to about 0.5:1, even more preferred is a ratio of from about 0.0001:1 to about 0.3:1, yet more preferred is a ratio of from about 0.0005:1 to about 0.1:1, and even more preferred is a ratio of from about 0.0005:1 to about 0.01:1.

When a binder is used, it is preferred that the ratio of the sum of the amount by weight of the phosphor (301) and the amount by weight of the light emitting material (401) to the amount by weight of the binder solids is within a range of from about 1:1 to about 50:1, more preferred to be within a range of from about 6:1 to about 30:1, and yet more preferred to be within a range of from about 4:1 to about 10:1.

The electroluminescent device of the present invention can be used in signs, displays, and, in fact, anywhere a conventional electroluminescent system is useful.

The following examples describe preferred embodiments of the invention. Other embodiments within the scope of the claims herein will be apparent to one skilled in the art from consideration of the specification or practice of the invention as disclosed herein. It is intended that the specification, together with the examples, be considered to be exemplary only, with the scope and spirit of the invention being indicated by the claims which follow the examples. In the examples all percentages are given on a weight basis unless otherwise indicated.

EXAMPLE 1

This example illustrates the production of an electroluminescent phosphor particle coated with a light-emitting material.

Particles of an electroluminescent phosphor, such as ZnS:Cu are prepared by precipitation, spray pyrolysis, spray chilling, and the like. Further reduction in particle size may be achieved by micronizing using an air mill or grinding them to an ultimate particle size of approximately 50 microns or less.

Phosphor particles of the desired size are then coated with a light-emitting material, such as poly(p-phenylene vinylene) or poly[2-methoxy-5-(2'-ethylhexyloxy)-1,4-phenylenevinylene]. In this process, the phosphor particles are fluidized in an air or nitrogen stream and the light-emitting material is spray coated onto the particles to form encapsulated particles (Light-Emitting Particles). In an alternative method, the light-emitting polymer can be dispersed or put into solution in a solvent. The light-emitting polymer solution is then added to the phosphor particles with mixing. When the particles are coated with the light-emitting polymer/solvent mixture, the solvent can be removed by evaporation, such as in a rotating/vacuum device while gentle heat is being applied.

If desired, a printing ink may be formulated by mixing the encapsulated phosphor particles with one or more binder polymers, such as, for example, poly(methylmethacrylate) or poly(butylmethacrylate), in a suitable solvent. The ink is then ready for storage or for application to form a part of an electroluminescent device.

EXAMPLE 2

This illustrates the fabrication and testing of of electroluminescent devices that incorporate light-emitting particles composed of various phosphor/light-emitting material combinations.

With gentle heating as needed, one gram of polymethylmethacrylate (PMMA), polystyrene (PS), or poly(vinylidenedifluoride) (PVDF) was dissolved in 10 grams of 1,2 dichloroethane (DCE), tetrahydrofuran (THF), xylene, terpinol mixed isomers (TERP), ethyldiglycol acetate (EDGA), or mixtures of two or more of these, in a 25 ml glass vial. In a separate 15 ml glass vial, 0.2 gm of particles of either TNE "white", or GGS "white" type phosphors, available from Sylvania Corporation, were mixed with 0.5 gm of MEHPPV. After the particles and the polymer were well mixed, 0.5 gm of the PMMA/DCE polymer carrier solution described above was added to the vial, and the contents were mixed and heated to 60° C. for one minute. The light-emitting material coated phosphor particles in the PMMA binder The amount of the phosphor particles, the binder, the MEHPPV, and the solvents were varied from the amounts described above in order to determine the effect of the relative amounts of each component. Combinations of phosphor, light-emitting material, binder, binder solvent, and relative amounts of these materials were used as shown in Table 1.

Electroluminescent devices of the general type shown in FIG. 5 were constructed by screen printing (through a polyester screen of 158 mesh) a first electrode (201) of PEDOT onto a sheet of polycarbonate (0.030" thick) used as the substrate (501). The PEDOT was cured at 220° F. Next, a layer of Allied UV curable ink, product number FD 3007 CL, available from Allied Photochemical, Inc., Kimball, Mich., was screen printed through a patterned 158 mesh screen onto the first electrode, but a 2 mm diameter well was left unprinted. One microliter of the mixture containing the light-emitting material-coated phosphor particles in the binder was added to the well and the binder was cured by heating to form a light emitting layer. When the light emitting layer was cured, a second electrode (202) of PEDOT was screen printed over the dielectric layer and the light-emitting layer well, and the PEDOT was cured as described above. Electrode leads of silver were screen printed to contact each PEDOT electrode. Each of the electroluminescent devices was connected to an AC source of controlled voltage and the devices were tested to determine (1) the minimum voltage (at 400 Hz) at which light was first emitted, (2) the intensity of emitted radiation at standard conditions of 340 v, 400 Hz., and (3) the color of the emitted radiation.

TABLE 1

Components and performance of electroluminescent devices.

| No. | Phosphor[a] | MEHPPV Conc.[b,c] | MEHPPV/ Phosphor ratio (wt/wt) | Binder[d] | Binder Solvent[e] | Binder Conc'n | MEHPPV + phosphor/ Binder ratio (wt/wt) | Freq. (kHz) | Power (volts) | Intensity (NITS) | Color x | Color y |
|---|---|---|---|---|---|---|---|---|---|---|---|---|
| OA | TNE | 1% | 0.01:1 | None | None | 0 | infinite | 0.4 | 61 | FLE[g] | n/a | n/a |
|  |  |  |  |  |  |  |  | 0.4 | 340 | 1.63 | n/a | n/a |
|  |  |  |  |  |  |  |  | 2 | 340 | 4.43 | n/a | na |
|  |  |  |  |  |  |  |  | 5 | 340 | 6.6 | n/a | n/a |
|  |  |  |  |  |  |  |  | 10 | 340 | 6.83 | n/a | n/a |
|  |  |  |  |  |  |  |  | 15 | 340 | 6.52 | n/a | n/a |
|  |  |  |  |  |  |  |  | 20 | 340 | 6.69 | n/a | n/a |
| 1 | 830 | 0.1% | 0.001:1 | PMMA | Acetonitrile | 20% | 5:1 | 0.4 | 340 | No light emission |  |  |
| 2 | 830 | 0.5% | 0.005:1 | PVS | MeOH | 20% | 5:1 | 0.4 | 74 | FLE | n/a | n/a |
|  |  |  |  |  |  |  |  | 0.4 | 340 | 0.95 | 0.463 | 0.378 |
|  |  |  |  |  |  |  |  | 2 | 340 | 2.38 | 0.439 | 0.346 |
|  |  |  |  |  |  |  |  | 5 | 340 | 3.34 | 0.418 | 0.324 |
|  |  |  |  |  |  |  |  | 10 | 340 | 4.18 | 0.406 | 0.301 |

TABLE 1-continued

Components and performance of electroluminescent devices.

| No. | Phosphor[a] | MEHPPV Conc.[b,c] | MEHPPV/ Phosphor ratio (wt/wt) | Binder[d] | Solvent[e] | Binder Conc'n | MEHPPV + phosphor/ Binder ratio (wt/wt) | Freq. (kHz) | Power (volts) | Intensity (NITS) | Color x | y |
|---|---|---|---|---|---|---|---|---|---|---|---|---|
| | | | | | | | | 15 | 340 | 3.95 | 0.390 | 0.289 |
| | | | | | | | | 20 | 340 | 3.33 | 0.385 | 0.286 |
| 3 | 830 | 0.1% | 0.001:1 | PMMA | Acetonitrile | 20% | 5:1 | 0.4 | 340 | No light | | |
| 4 | 830 | 0.1% | 0.001:1 | PVB | MeOH | 20% | 5:1 | 0.4 | 54 | FLE | n/a | n/a |
| | | | | | | | | 0.4 | 340 | 1.32 | 0.379 | 0.367 |
| | | | | | | | | 2 | 340 | 3.41 | 0.359 | 0.313 |
| | | | | | | | | 5 | 340 | 4.68 | 0.329 | 0.283 |
| | | | | | | | | 10 | 340 | 6.95 | 0.31 | 0.262 |
| | | | | | | | | 15 | 340 | 7.29 | 0.299 | 0.246 |
| | | | | | | | | 20 | 340 | 7.38 | 0.285 | 0.236 |
| 5 | 830 | 0.1% | 0.001:1 | PVDF | Terp-EDGA | 25% | 4:1 | 0.4 | 31 | FLE | | |
| | | | | | | | | 0.4 | 340 | 11.8 | 0.376 | 0.377 |
| | | | | | | | | 2 | 340 | 34.1 | 0.345 | 0.333 |
| | | | | | | | | 5 | 340 | 50.2 | 0.319 | 0.303 |
| | | | | | | | | 10 | 340 | 76.4 | 0.299 | 0.280 |
| | | | | | | | | 15 | 340 | 88.1 | 0.281 | 0.260 |
| | | | | | | | | 20 | 340 | 95.6 | 0.270 | 0.255 |
| 6 | 830 | 0.1% | 0.001:1 | PVB | MeOH | 20% | 5:1 | 0.4 | 27.6 | FLE | | |
| | | | | | | | | 0.4 | 340 | 5.77 | 0.372 | 0.366 |
| | | | | | | | | 2 | 340 | 15.3 | 0.339 | 0.317 |
| | | | | | | | | 5 | 340 | 21.7 | 0.308 | 0.283 |
| | | | | | | | | 10 | 340 | 31.4 | 0.287 | 0.258 |
| | | | | | | | | 15 | 340 | 34.3 | 0.272 | 0.241 |
| | | | | | | | | 20 | 340 | 35.9 | 0.263 | 0.231 |
| 7 | 830 | 0.5% | 0.005:1 | PMMA | Acetonitrile | 20% | 5:1 | 0.4 | 50 | FLE | | |
| | | | | | | | | 0.4 | 340 | 2.82 | 0.411 | 0.367 |
| | | | | | | | | 2 | 340 | 8.33 | 0.379 | 0.324 |
| | | | | | | | | 5 | 340 | 12.4 | 0.346 | 0.294 |
| | | | | | | | | 10 | 340 | 17 | 0.320 | 0.268 |
| | | | | | | | | 15 | 340 | 20.1 | 0.305 | 0.265 |
| | | | | | | | | 20 | 340 | 20.1 | 0.297 | 0.270 |
| 8 | 830 | 0.5% | 0.005:1 | PVDF | Terp-EDGA | 25% | 4:1 | 0.4 | 46 | FLE | | |
| | | | | | | | | 0.4 | 340 | 9.6 | 0.415 | 0.378 |
| | | | | | | | | 2 | 340 | 27.7 | 0.390 | 0.34 |
| | | | | | | | | 5 | 340 | 39.9 | 0.361 | 0.312 |
| | | | | | | | | 10 | 340 | 50.6 | 0.337 | 0.289 |
| | | | | | | | | 15 | 340 | 52 | 0.327 | 0.278 |
| | | | | | | | | 20 | 340 | 51.2 | 0.309 | 0.27 |
| 9 | 830 | 0.1% | 0.001:1 | PVDF | Terp-EDGA | 25% | 4:1 | 0.4 | 30 | FLE | | |
| | | | | | | | | 0.4 | 340 | 12.3 | 0.361 | 0.377 |
| | | | | | | | | 2 | 340 | 35.6 | 0.33 | 0.327 |
| | | | | | | | | 5 | 340 | 53.3 | 0.3 | 0.293 |
| | | | | | | | | 10 | 340 | 84.7 | 0.278 | 0.269 |
| | | | | | | | | 15 | 340 | 96.4 | 0.262 | 0.255 |
| | | | | | | | | 20 | 340 | 104 | 0.251 | 0.246 |
| 10 | TNE | 0.5% | 0.005:1 | PMMA | Adetonitrile | 20% | 5:1 | 0.4 | 110 | FLE | | |
| | | | | | | | | 0.4 | 340 | 0.11 | 0.531 | 0.468 |
| | | | | | | | | 2 | 340 | 0.15 | 0.457 | 0.467 |
| | | | | | | | | 5 | 340 | 0.18 | 0.466 | 0.468 |
| | | | | | | | | 10 | 340 | 0.23 | 0.408 | 0.447 |
| | | | | | | | | 15 | 340 | 0.21 | 0.39 | 0.453 |
| | | | | | | | | 20 | 340 | 0.21 | 0.437 | 0.457 |
| 11A | TNE | 0.5% | 0.005:1 | PVDF | Terp-EDGA | 25% | 4:1 | 0.4 | 29.4 | FLE | | |
| | | | | | | | | 0.4 | 340 | 10.1 | n/a | n/a |
| | | | | | | | | 2 | 340 | 31.2 | 0.302 | 0.279 |
| | | | | | | | | 5 | 340 | 47.3 | 0.271 | 0.239 |
| | | | | | | | | 10 | 340 | 68.7 | 0.252 | 0.213 |
| | | | | | | | | 15 | 340 | 76.6 | 0.241 | 0.2 |
| | | | | | | | | 20 | 340 | 89.6 | 0.235 | 0.195 |
| 11B | TNE | 1% | 0.01:1 | PVDF | Terp-EDGA | 25% | 4:1 | 0.4 | 35.2 | FLE | | |
| | | | | | | | | 0.4 | 340 | 7.01 | n/a | n/a |
| | | | | | | | | 2 | 340 | 21.1 | 0.317 | 0.293 |
| | | | | | | | | 5 | 340 | 33.8 | 0.289 | 0.256 |
| | | | | | | | | 10 | 340 | 43.5 | 0.266 | 0.226 |

TABLE 1-continued

Components and performance of electroluminescent devices.

| No. | Phosphor[a] | MEHPPV Conc.[b,c] | MEHPPV/ Phosphor ratio (wt/wt) | Binder[d] | Binder Solvent[e] | Binder Conc'n | MEHPPV + phosphor/ Binder ratio (wt/wt) | Freq. (kHz) | Power (volts) | Intensity (NITS) | Color x | y |
|---|---|---|---|---|---|---|---|---|---|---|---|---|
| | | | | | | | | 15 | 340 | 49.4 | 0.254 | 0.212 |
| | | | | | | | | 20 | 340 | 54.9 | 0.246 | 0.204 |
| 12 | TNE | 0.1% | 0.001:1 | PMMA | Acetonitrile | 20% | 5:1 | 0.4 | 38 | FLE | | |
| | | | | | | | | 0.4 | 340 | 8.35 | 0.353 | 0.364 |
| | | | | | | | | 2 | 340 | 23.2 | 0.327 | 0.31 |
| | | | | | | | | 5 | 340 | 33.5 | 0.299 | 0.273 |
| | | | | | | | | 10 | 340 | 45.7 | 0.278 | 0.243 |
| | | | | | | | | 15 | 340 | 46.3 | 0.266 | 0.23 |
| | | | | | | | | 20 | 340 | 42.8 | 0.259 | 0.222 |
| 13 | TNE | 0.1% | 0.001:1 | PVB | MeOH | 20% | 5:1 | 0.4 | 45.2 | FLE | | |
| | | | | | | | | 0.4 | 340 | 2.77 | 0.328 | 0.34 |
| | | | | | | | | 2 | 340 | 7.5 | 0.3 | 0.277 |
| | | | | | | | | 5 | 340 | 10.4 | 0.273 | 0.24 |
| | | | | | | | | 10 | 340 | 13.7 | 0.253 | 0.215 |
| | | | | | | | | 15 | 340 | 14.2 | 0.248 | 0.211 |
| 14 | TNE | 0.5% | 0.005:1 | PS | Xylene | 10% | 10:1 | 0.4 | 47.6 | FLE | | |
| | | | | | | | | 0.4 | 340 | 1.61 | n/a | n/a |
| | | | | | | | | 2 | 340 | 4.65 | n/a | n/a |
| | | | | | | | | 5 | 340 | 7.38 | n/a | n/a |
| | | | | | | | | 10 | 340 | 8.51 | 0.318 | 0.249 |
| | | | | | | | | 15 | 340 | 9.8 | 0.305 | 0.235 |
| | | | | | | | | 20 | 340 | 11 | 0.297 | 0.226 |
| 15 | TNE | 0.1% | 0.001:1 | PVB | MeOH | 20% | 5:1 | 0.4 | 46 | FLE | | |
| | | | | | | | | 0.4 | 340 | 3.78 | 0.321 | 0.336 |
| | | | | | | | | 2 | 340 | 10.8 | 0.292 | 0.275 |
| | | | | | | | | 5 | 340 | 17 | 0.266 | 0.237 |
| | | | | | | | | 10 | 340 | 18.3 | 0.246 | 0.208 |
| | | | | | | | | 15 | 340 | 19.8 | 0.236 | 0.20 |
| 16A | TNE | 0.1% | 0.001:1 | PVDF | Terp-EDGA | 25% | 4:1 | 0.4 | 43 | FLE | | |
| | | | | | | | | 0.4 | 340 | 16.2 | 0.318 | 0.33 |
| | | | | | | | | 2 | 340 | 47.9 | 0.289 | 0.273 |
| | | | | | | | | 5 | 340 | 75 | 0.263 | 0.236 |
| | | | | | | | | 10 | 340 | 87.5 | 0.243 | 0.209 |
| | | | | | | | | 15 | 340 | 97.9 | 0.234 | 0.201 |
| | | | | | | | | 20 | 340 | 104 | 0.236 | 0.212 |
| 16B | TNE | 1% | 0.01:1 | PMMA | DCE | 10% | 10:1 | 0.4 | 84.8 | FLE | | |
| | | | | | | | | 0.4 | 340 | 0.06 | n/a | n/a |
| | | | | | | | | 2 | 340 | 0.18 | n/a | n/a |
| | | | | | | | | 5 | 340 | 0.26 | n/a | n/a |
| | | | | | | | | 10 | 340 | 0.24 | n/a | n/a |
| | | | | | | | | 15 | 340 | 0.2 | n/a | n/a |
| | | | | | | | | 20 | 340 | 0.15 | n/a | n/a |
| 17A | TNE | 0.1% | 0001.1 | PMMA | Acetonitrile | 20% | 5:1 | 0.4 | 136 | FLE | | |
| | | | | | | | | 0.4 | 340 | 0.15 | 0.414 | 0.505 |
| | | | | | | | | 2 | 340 | 0.29 | 0.369 | 0.443 |
| | | | | | | | | 5 | 340 | 0.44 | 0.325 | 0.416 |
| | | | | | | | | 10 | 340 | 0.65 | 0.307 | 0.368 |
| | | | | | | | | 15 | 340 | 0.72 | 0.304 | 0.334 |
| | | | | | | | | 20 | 340 | 0.75 | 0.287 | 0.34 |
| 17B | TNE | 0.5% | 0.005:1 | PMMA | Acetonitrile | 20% | 5:1 | 0.4 | 40 | FLE | | |
| | | | | | | | | 0.4 | 340 | 2.23 | 0.406 | 0.385 |
| | | | | | | | | 2 | 340 | 6.41 | 0.375 | 0.33 |
| | | | | | | | | 5 | 340 | 9.16 | 0.347 | 0.294 |
| | | | | | | | | 10 | 340 | 13.4 | 0.325 | 0.267 |
| | | | | | | | | 15 | 340 | 14.2 | 0.312 | 0.252 |
| | | | | | | | | 20 | 340 | 14.5 | 0.302 | 0.24 |
| 18 | TNE | 0.1% | 0.001:1 | PVDF | Terp-EDGA | 25% | 4:1 | 0.4 | 40 | FLE | | |
| | | | | | | | | 0.4 | 340 | 18.5 | 0.325 | 0.314 |
| | | | | | | | | 2 | 340 | 55.3 | 0.297 | 0.283 |
| | | | | | | | | 5 | 340 | 82.6 | 0.27 | 0.246 |
| | | | | | | | | 10 | 340 | 101 | 0.253 | 0.228 |
| | | | | | | | | 15 | 340 | 102 | 0.249 | 0.227 |
| | | | | | | | | 20 | 340 | 95.6 | 0.25 | 0.236 |
| 19 | GGS | 0% | 0 | PVDF | Terp-EDGA | 25% | 4:1 | 0.4 | 39.2 | FLE | | |
| | | | | | | | | 0.4 | 340 | 15.4 | 0.294 | 0.335 |
| | | | | | | | | 2 | 340 | 44.9 | 0.263 | 0.26 |

TABLE 1-continued

Components and performance of electroluminescent devices.

| No. | Phosphor[a] | MEHPPV Conc.[b,c] | MEHPPV/ Phosphor ratio (wt/wt) | Binder[d] | Binder Solvent[e] | Binder Conc'n | MEHPPV + phosphor/ Binder ratio (wt/wt) | Freq. (kHz) | Power (volts) | Intensity (NITS) | Color x | Color y |
|---|---|---|---|---|---|---|---|---|---|---|---|---|
| | | | | | | | | 5 | 340 | 70.3 | 0.241 | 0.222 |
| | | | | | | | | 10 | 340 | 83.4 | 0.226 | 0.197 |
| | | | | | | | | 15 | 340 | 97.2 | 0.219 | 0.189 |
| | | | | | | | | 20 | 340 | 101 | 0.216 | 0.188 |
| 20 | GGS | 0% | 0 | PVDF | Terp-EDGA | 25% | 4:1 | 0.4 | | 34.8 | FLE | |
| | | | | | | | | 0.4 | 340 | 13.1 | 0.295 | 0.336 |
| | | | | | | | | 2 | 340 | 40.2 | 0.263 | 0.262 |
| | | | | | | | | 5 | 340 | 67.5 | 0.241 | 0.223 |
| | | | | | | | | 10 | 340 | 92 | 0.225 | 0.198 |
| | | | | | | | | 15 | 340 | 110 | 0.217 | 0.187 |
| | | | | | | | | 20 | 340 | 125 | 0.213 | 0.182 |
| 21 | TNE | 0% | 0 | PVDF | Terp-EDGA | 25% | 4:1 | 0.4 | | 31.8 | FLE | |
| | | | | | | | | 0.4 | 340 | 21.3 | 0.270 | 0.31 |
| | | | | | | | | 2 | 340 | 62.3 | 0.247 | 0.249 |
| | | | | | | | | 5 | 340 | 100 | 0.226 | 0.213 |
| | | | | | | | | 10 | 340 | 116 | 0.212 | 0.188 |
| | | | | | | | | 15 | 340 | 127 | 0.204 | 0.177 |
| | | | | | | | | 20 | 340 | 138 | 0.201 | 0.176 |
| 22 | TNE | 0% | 0 | PVDF | Terp-EDGA | 25% | 4:1 | 0.4 | | 69.4 | FLE | |
| | | | | | | | | 0.4 | 340 | 20.7 | 0.275 | 0.328 |
| | | | | | | | | 2 | 340 | 61.2 | 0.250 | 0.262 |
| | | | | | | | | 5 | 340 | 102 | 0.228 | 0.222 |
| | | | | | | | | 10 | 340 | 129 | 0.211 | 0.194 |
| | | | | | | | | 15 | 340 | 160 | 0.203 | 0.182 |
| | | | | | | | | 20 | 340 | 178 | 0.198 | 0.176 |
| 23 | TNE | 0.05% | 0.0005:1 | PVDF | Terp-EDGA | 25% | 4:1 | 0.4 | | 35.6 | FLE | |
| | | | | | | | | 0.4 | 340 | 17.2 | 0.328 | 0.338 |
| | | | | | | | | 2 | 340 | 49 | 0.301 | 0.281 |
| | | | | | | | | 5 | 340 | 75.9 | 0.274 | 0.245 |
| | | | | | | | | 10 | 340 | 83.4 | 0.254 | 0.219 |
| | | | | | | | | 15 | 340 | 90.8 | 0.246 | 0.212 |
| | | | | | | | | 20 | 340 | 85.5 | 0.243 | 0.213 |
| 24 | TNE | 0.05% | 0.0005:1 | PMMA | THF | 20% | 5:1 | 0.4 | | 61.4 | FLE | |
| | | | | | | | | 0.4 | 340 | 1.6 | n/a | n/a |
| | | | | | | | | 2 | 340 | 4.39 | n/a | n/a |
| | | | | | | | | 5 | 340 | 6.33 | n/a | n/a |
| | | | | | | | | 10 | 340 | 6.56 | 0.263 | 0.224 |
| | | | | | | | | 15 | 340 | 6.64 | 0.255 | 0.214 |
| | | | | | | | | 20 | 340 | 6.44 | 0.251 | 0.214 |
| 25 | TNE | 0.05% | 0.0005:1 | PS | Xylene | 20% | 5:1 | 0.4 | | 42.5 | FLE | |
| | | | | | | | | 0.4 | 340 | 6.42 | n/a | n/a |
| | | | | | | | | 2 | 340 | 19.1 | 0.310 | 0.289 |
| | | | | | | | | 5 | 340 | 30.6 | 0.284 | 0.256 |
| | | | | | | | | 10 | 340 | 35.3 | 0.264 | 0.226 |
| | | | | | | | | 15 | 340 | 36.7 | 0.253 | 0.213 |
| | | | | | | | | 20 | 340 | 38.2 | 0.247 | 0.208 |
| 26 | TNE | 0.5% | 0.005:1 | PVB | MeOH | 20% | 5:1 | 0.4 | | 39 | FLE | |
| | | | | | | | | 0.4 | 340 | 4.32 | 0.359 | 0.344 |
| | | | | | | | | 2 | 340 | 12.5 | 0.326 | 0.286 |
| | | | | | | | | 5 | 340 | 18.2 | 0.296 | 0.249 |
| | | | | | | | | 10 | 340 | 26.4 | 0.275 | 0.221 |
| | | | | | | | | 15 | 340 | 28.3 | 0.262 | 0.207 |
| | | | | | | | | 20 | 340 | 28.9 | 0.255 | 0.200 |
| 27 | TNE | 0.5% | 0.005:1 | PVB | MeOH | 20% | 5:1 | 0.4 | | 102 | FLE | |
| | | | | | | | | 0.4 | 340 | 5.11 | 0.345 | 0.361 |
| | | | | | | | | 2 | 340 | 14.4 | 0.311 | 0.297 |
| | | | | | | | | 5 | 340 | 21.8 | 0.280 | 0.254 |
| | | | | | | | | 10 | 340 | 32.2 | 0.259 | 0.223 |
| | | | | | | | | 15 | 340 | 35.6 | 0.245 | 0.206 |
| | | | | | | | | 20 | 340 | 37.6 | 0.237 | 0.195 |
| 28 | 830 | 0% | 0 | PVDF | Terp-EDGA | 25% | 4:1 | 0.4 | | 31 | FLE | |
| | | | | | | | | 0.4 | 340 | 20.6 | 0.294 | 0.343 |
| | | | | | | | | 2 | 340 | 58.3 | 0.271 | 0.289 |
| | | | | | | | | 5 | 340 | 86.6 | 0.249 | 0.256 |

TABLE 1-continued

Components and performance of electroluminescent devices.

| No. | Phosphor[a] | MEHPPV Conc.[b,c] | MEHPPV/ Phosphor ratio (wt/wt) | Binder[d] | Binder Solvent[e] | Binder Conc'n | MEHPPV + phosphor/ Binder ratio (wt/wt) | Characterization of light emission[f] ||||
|---|---|---|---|---|---|---|---|---|---|---|---|
| | | | | | | | | Freq. (kHz) | Power (volts) | Intensity (NITS) | Color x | y |
| | | | | | | | | 10 | 340 | 122 | 0.232 | 0.23 |
| | | | | | | | | 15 | 340 | 131 | 0.223 | 0.218 |
| | | | | | | | | 20 | 340 | 130 | 0.217 | 0.215 |
| 29 | 830 | 0% | 0 | PMMA | Acetonitrile | 20% | 5:1 | 0.4 | 35 | FLE | | |
| | | | | | | | | 0.4 | 340 | 8.99 | 0.295 | 0.342 |
| | | | | | | | | 2 | 340 | 25.8 | 0.272 | 0.287 |
| | | | | | | | | 5 | 340 | 38 | 0.251 | 0.253 |
| | | | | | | | | 10 | 340 | 52.1 | 0.234 | 0.229 |
| | | | | | | | | 15 | 340 | 56.4 | 0.224 | 0.22 |
| | | | | | | | | 20 | 340 | 54.5 | 0.22 | 0.217 |
| 30 | 830 | 0% | 0 | PVB | MeOH | 20% | 5:1 | 0.4 | 32 | FLE | | |
| | | | | | | | | 0.4 | 340 | 8.99 | 0.291 | 0.34 |
| | | | | | | | | 2 | 340 | 27.2 | 0.271 | 0.289 |
| | | | | | | | | 5 | 340 | 40.7 | 0.25 | 0.253 |
| | | | | | | | | 10 | 340 | 57.1 | 0.233 | 0.228 |
| | | | | | | | | 15 | 340 | 61.9 | 0.224 | 0.220 |
| | | | | | | | | 20 | 340 | 58.5 | 0.219 | 0.214 |

Notes:
[a]Phosphors are particulate; "830", "TNE", and "GGS" ("white") phosphors from Sylvania Corporation;
[b]The light-emitting material in each case was poly[2-methoxy-5-(2'-ethylhexyloxy)-1,4-phenylenevinylene], (MEHPPV).
[c]Dichloroethane (DCE) was used as the solvent for MEHPPV in those devices that included MEHPPV.
[d]Binders used included polymethylmethacrylate (PMMA), polystyrene (PS), poly(vinylidenedifluoride) (PVDF), and polyvinylbutyral (PVB).
[e]Binder solvents that were used included tetrahydrofuran (THF), xylene, methanol (MeOH), acetonitrile, dichloroethane (DCE), and terpinol mixed isomers blended with ethyldiglycol acetate (Terp-EDGA).
[f]Illumination intensity and color measurements were taken in a light controlled room where all the extraneous light is eliminated and only the light radiating from the device under test is sensed and measured. The measurements were taken with a Minolta brand Chroma Meter, Model CS-100A. This meter measures both Luminance and Chromaticity values, and reads out in Y,x, y. The luminance (Y) is measured in candellas per square meter, and is currently referred to as NITS. The chromaticity or color is measured in what is known as the "1931 CIE Color System" using the units x, y. The x, y values are coordinates representing the color in two dimensional space, independent of intensity, on a graph known as the "1931 x, y chromaticity diagram".
The term "n/a" means that the data was not available.
[g]The voltage at which light emission was first detected at a frequency of 400 Hz was recorded as First Emitted Light (FLE).

EXAMPLE 3

This illustrates the construction of an electroluminescent device.

With reference to FIG. 8, a first electrode 201 is printed onto a suitable substrate (501) in a desired pattern or patterns. Next, a light-emitting layer (105), comprising light-emitting particles (103) in a dielectric binder material (601), is printed onto the first electrode patterns. Then, a transparent second electrode (202) is printed onto the light-emitting layer (105).

After curing the light-emitting layer (105), a front outlining electrode lead (FOEL) (903) is printed onto the second electrode (202). Appropriate connection leads (Ag or C) to the first electrode (901) and to the FOEL (902) are then printed.

The first electrode and the second electrode may be fabricated using conductive polymers to provide a totally polymeric system without metals or metallic compounds.

FIG. 9 is a schematic illustration of an alternative embodiment of an electroluminescent (EL) multi-segment display device comprising a substrate (501), a first electrode layer (201), a dielectric layer (701), a light-emitting layer (105), an electrically conductive layer, or second electrode (202), and a front outlining electrode lead (903). The substrate (501) may comprise either metal or an electrically non-conducting material. If, for example, an aluminum substrate is used, then it is first coated with an insulative material.

The first electrode (201) is formed of an electrically conductive material, for example, silver or carbon particles. Dielectric layer (701) is formed of high dielectric constant material, such as barium titanate. The illumination layer (105) is formed of light-emitting particles (103) mixed with a dielectric binder (601), as described above. The second electrode (202) may be formed of indium tin oxide (ITO), silver particles, or other electrically conductive material.

The present device can be fabricated by first printing the first electrode (201) onto the substrate (501). If the substrate is a metal or other conductor, such as aluminum, then an insulative coating is first applied over the substrate using a compound such as Nazdar's Plastic Plus (Nazdar Mid-America, St. Louis, Mo.). If the substrate is formed from a non-conductor, such as a polyester film, polycarbonate, or other plastic material, no coating is required.

The first electrode (201) is applied over a front surface of the substrate (501). In an exemplary embodiment, the first electrode (201) is formed of conductive particles, for example, silver or carbon, dispersed in a polymeric or other binder to form a screen printable ink. In one embodiment, the first electrode may comprise a silver particle ink such as DuPont 7145. Alternatively, the first electrode may comprise a conductive polymer such as polyaniline, polypyrrole, and poly(3,4-ethylenedioxythiophene). In an exemplary embodiment, a carbon first electrode may have a thickness of between approximately 0.2 millimeters and 0.6 millimeters. However, any suitable electrode thickness may be employed. It is to be noted that the first electrode layer (201), as well as each of the layers that are successively applied in fabricating the device (101), may be applied by any appropriate method, including an ink jet process, a stencil, flat coating, brushing, rolling, spraying, etc.

The first electrode layer (201) may cover the entire substrate (501), but this layer typically covers only the illumination area (the area covered by the light-emitting layer (105), described below).

After the first electrode layer is cured, an optional dielectric layer (701) can be applied over the first electrode layer (201). In an exemplary embodiment, a dielectric layer comprises a high dielectric constant material, such as barium titanate dispersed in a polymeric binder to form a screen printable ink. In one embodiment, the dielectric may be an ink, such as DuPont 7153. The dielectric layer (701) may cover the substrate either entirely, or may alternatively cover only the illumination area. Alternatively, the dielectric layer (701) may include a high dielectric constant material such as alumina oxide dispersed in a polymeric binder. The alumina oxide layer can be applied over the first electrode and cured by exposure to UV light. In an exemplary embodiment, the dielectric layer (701) may have a thickness of between approximately 20 microns and 31 microns.

In one embodiment, the dielectric layer has substantially the same shape as the illumination area, but extends approximately $\frac{1}{16}$" to $\frac{1}{8}$" beyond the illumination area. Alternatively, the dielectric layer may cover substantially all of the substrate (501).

Upon curing the dielectric layer (701), the illumination layer (105) is applied over the dielectric layer. The illumination layer (105) is formulated in accordance with the process described above. The size of the illumination area covered by the illumination layer (105) may range from approximately 1 sq. mm to 1000 sq. cm., or more. In an exemplary embodiment of the present system, the illumination layer comprises light-emitting material-coated phosphor particles (103), and has a thickness of between approximately 20 microns and 31 microns.

Next, the second electrode (202) is printed over the light-emitting layer (105), extending about $\frac{1}{16}$" to $\frac{1}{8}$" beyond the area covered by the light-emitting layer (105). The distance beyond the illumination layer to which the second electrode (202) extends is a function of the size of the device. Accordingly, the extension of the second electrode (202) beyond the illumination area may advantageously be between approximately 2 percent and 10 percent of the width of the illumination layer. In an exemplary embodiment, the second electrode (202) comprises indium tin oxide (ITO) particles in the form of a screen printable ink such as DuPont 7160. In an alternative embodiment, the second electrode is non-metallic and is translucent or transparent, and comprises a conductive polymer, such as polyaniline, polypyrrole, or poly(3,4-ethylenedioxythiophene). In an exemplary embodiment, an ITO conductive layer (202) may have a thickness of between approximately 5 microns and 13 microns.

Next, a front outlining electrode layer 903, comprising a conductive material such as silver or carbon, is applied onto the outer perimeter of the second electrode (202) to transport electrical current thereto. The front electrode lead (903) is typically a $\frac{1}{16}$" to $\frac{1}{8}$" wide strip, approximately 2 percent to 20 percent of the width of the second electrode (202) depending on the current drawn by device 101 and the length of the device from the controller or power source. For example, the front electrode lead (903) may be approximately $\frac{1}{8}$" wide for a 50" wire run from the controller.

The front outlining electrode leads (903) may be screen printed onto the second electrode (202), or may be fabricated as interconnect tabs extending beyond the substrate to facilitate connection to a power source or controller. In one embodiment, the front outlining electrode layer contacts substantially the entire outer perimeter of the second electrode layer (202) and does not overlap the first electrode (201). In an alternative embodiment, the front electrode lead (903) contacts only about 25% of outer perimeter of the second electrode (202). The front electrode lead (903) may be fabricated to contact any amount of the outer perimeter of the second electrode (202), from about 25% to about 100%. The front outlining electrode lead (903) may, for example, comprise silver particles that form a screen-printable ink, such as DuPont 7145. In an alternative embodiment, front outlining electrode lead (903) is non-metallic and is translucent or transparent, and comprises a conductive polymer, such as polyaniline, polypyrrole, or poly(3,4-ethylenedioxythiophene). Fabricating the first and the second electrodes and the front outlining electrode lead with polymers such as the aforementioned compounds would make device 101 more flexible, as well as more durable and corrosion resistant. In an exemplary embodiment, a silver front outlining electrode layer (903) may have a thickness of between approximately 20 microns and 28 microns.

Figure 10:
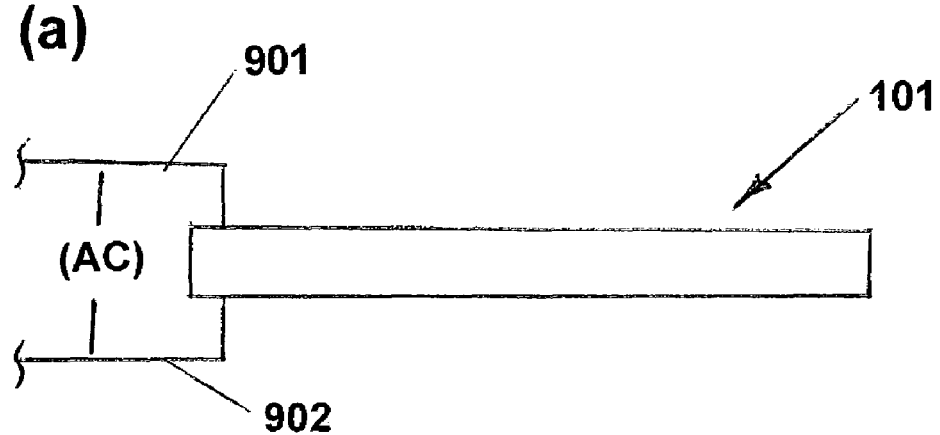
FIG. 10 is an illustration of an edge view (a) and an oblique view (b) of an electroluminescent display showing a first and a second electrical lead connecting a source of alternating current to the first electrode and the second electrode, respectively, of an electroluminescent device of the present invention, and with the oblique view showing an illuminated element in the form of a letter "A".
Figure 10:
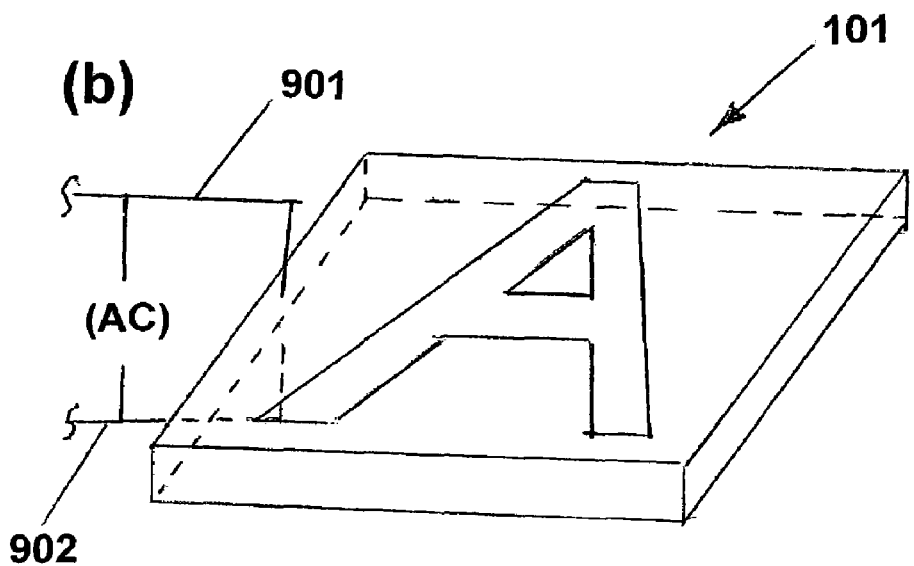

The electroluminescent device (101) that is fabricated by this method can be connected to a source of alternating current as shown in FIG. 10, for example, in order to provide an operating electroluminescent system. If desired, a battery can be used to supply the current in conjunction with suitable phase inverting devices. Any number and type of other electrical plugs, timers, connectors, switches, and the like can also be added to the circuit in which the electroluminescent device is placed.

All references cited in this specification, including without limitation all papers, publications, patents, patent applications, presentations, texts, reports, manuscripts, brochures, books, internet postings, journal articles, periodicals, and the like, are hereby incorporated by reference into this specification in their entireties. The discussion of the references herein is intended merely to summarize the assertions made by their authors and no admission is made that any reference constitutes prior art. Applicants reserve the right to challenge the accuracy and pertinency of the cited references.

In view of the above, it will be seen that the several advantages of the invention are achieved and other advantageous results obtained.

As various changes could be made in the above methods and compositions without departing from the scope of the invention, it is intended that all matter contained in the above description and shown in the accompanying drawings shall be interpreted as illustrative and not in a limiting sense.

What is claimed is:

1. A luminescent device comprising an electroluminescent phosphor in operative contact with a light-emitting material, both of which are located between a first electrode and a second electrode, wherein the first electrode and the second electrode are free of metals and metal oxides and wherein excitation of the electroluminescent phosphor by an alternating current electrical field causes the emission of light by the light-emitting material.

2. The device according to claim 1, wherein the electroluminescent phosphor is present in an insulating layer which is located between the first electrode and the second electrode.

3. The device according to claim 1, wherein the first electrode and the second electrode comprise an intrinsically conductive polymer.

4. The device according to claim 3, wherein the first electrode and the second electrode comprise a substituted or unsubstituted intrinsically conductive polymer that is selected from the group consisting of polyaniline, polyacetylene, poly-p-phenylene, poly-m-phenylene, polyphenylene sulfide, polypyrrole, polythiophene, and polycarbazole.

5. The device according to claim 4, wherein the first electrode and the second electrode comprise poly(3,4-ethylenedioxythiophene).

6. The device according to claim 2, wherein the light-emitting material is located in the insulating layer.

7. The device according to claim 2, wherein the electroluminescent phosphor can be excited by an alternating current electric field and can emit light at a first wavelength.

8. The device according to claim 1, wherein the electroluminescent phosphor is selected from the group consisting of:
CdSe;
InAs;
$LaPO_4$, undoped or doped with one or more of Pr, Nd, Er, or Yb;
YOS, undoped or doped with Er;
ZnS, undoped, or doped with Ag, Cu, Mn, Tb, TbF, or $TbF_3$;
ZnSe; undoped or doped with Mn, or Cu;
ZnCdS;
$M^{IIA}M_2^{III}(S, Se)_4$, where $M^{IIA}$=Ca, Sr or Ba, and $M^{III}$=Al, Ga, In, Y, or is optionally absent, where the compound is undoped, or doped with $Eu^{2+}$ or $Ce^{3+}$;
and mixtures thereof.

9. The device according to claim 1, wherein the electroluminescent phosphor is in the form of particles.

10. The device according to claim 1, wherein the electroluminescent phosphor is an organic material.

11. The device according to claim 1, wherein the light-emitting material is a material which is excited when in operative contact with the excited electroluminescent phosphor and which is capable of emitting light of a wavelength that is different than the light emitted by the electroluminescent phosphor.

12. The device according to claim 11, wherein the light-emitting material is an inorganic solid that is selected from the group consisting of $LaPO_4$, undoped or doped with one or more of Pr, Nd, Er, or Yb;
YOS, undoped or doped with Er;
$M^{IIA}M_2^{III}(S, Se)_4$, where $M^{IIA}$=Ca, Sr or Ba, and $M^{III}$=Al, Ga, In, Y, or is optionally absent, and where the compound is undoped, or doped with $Eu^{2+}$ or $Ce^{3+}$;
and mixtures thereof.

13. The device according to claim 11, wherein the light-emitting material is an organic material.

14. The device according to claim 13, wherein the light-emitting material is selected from the group consisting of: anthracene, undoped or doped with tetracene, aluminum tris(8-hydroxyquinolinate), poly-(p-phenylenevinylene) (PPV), poly[2-methoxy-5-(2'-ethyl)hexoxy-1,4-phenylenevinylene] (MEHPPV), poly[2-methoxy-5-(2'-ethylhexyloxy)-1,4-phenylenevinylene-co-4,4'-bisphenylenevinylene] (MEH-BP-PPV), poly[2-methoxy-5-(2'-ethylhexyloxy)-1-(cyanovinylene)phenylene (MEH-CN-PPV), poly[1,3-propanedioxy-1,4-phenylene-1,2-ethylene-(2,5-bis(trimethylsilyl)-1,4-phenylene)-1,2-ethylene-1,4-phenylene] (DiSiPV), Tb tris(acetylacetonate), Eu(1,10-phenanthroline)-tris(4,4,4-trifluoro-1-(2-thienyl)butane-1,3-dionate, Eu tris(dibenzoylmethanato)phenanthroline, Tb tris (acetylacetonate)phenanthroline, Eu(4,7-diphenyl phenanthroline)-tris(4,4,4-trifluoro)-1-(2-thienyl)-butane-1, 3-dionate, Nd(4,7-diphenylphenanthroline)(dibenzoylmethanato)$_3$, Eu(dibenzolmethanato)$_3$-2-(2-pyridyl)benzimidazole, Eu(dibenzolmethanato)$_2$-1-ethyl-2-(2-pyridyl) benzimidazole, Tb-[3-(5-phenyl-1,3,4-oxadiazol-2-yl)-2,4-pentanedionate]$_3$, lanthanide-tris(4-methylbenzoate), lanthanide-tris(4-methoxybenzoate), Tb tris(4-methylbenzoate), Tb tris(4-methoxybenzoylbenzoate), Eu tris(4-methoxybenzoylbenzoate), Tb-tris(tetradecylphethalate)phenanthroline, Tb-imidodiphosphinate, Tb 1-phenyl-3-methyl-4-(trimethylacetyl)pyrazol-4-one, polypyridine; poly(p-phenylenevinylene), poly[2-methoxy-5-(2'-ethylhexyloxy)-1,4-phenylenevinylene], poly[2-methoxy-5-(2-ethylhexyloxy)-1,4-phenylene-vinylene], poly[(2-methoxy-5-(2-ethylhexyloxy)-1,4-phenylene-vinylene)-alt-co-(4,4'-biphenylenevinylene)], poly[(9,9-dioctyl-2,7-divinylenefluorenylene)-alt-co-(9,10-anthracene)], poly[(9, 9-dioctyl-2,7-divinylenefluorenylene)-alt-co-(4,4'-biphenylene)], poly[{9,9-dioctyl-2,7-divinylene-fluorenylene}-alt-co-{2-methoxy-5-(2-ethyl-hexyloxy)-1,4-phenylene}], poly[{9,9-dioctyl-2,7-bis(2-cyanovinylene-fluorenylene}-alt-co-{2-methoxy-5-(2-ethylhexyloxy)-1,4-phenylene}], poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N,N'-diphenylamino)-1,4-phenylene}], poly[{9-ethyl-3,6-bis(2-cyanovinylene)carbazolylene)}-alt-co-{2-methoxy-5-(2-ethylhexyloxy)-1,4-phenylene}], poly[(9,9-di(2-ethylhexyl)-fluorenyl-2,7-diyl)-co-(N,N'-diphenyl)-N,N'-di-(p-butylphenyl)-1,4-diaminobenzene], poly[2-(6-cyano-6-methylheptyloxy)-1,4-phenylene), poly[{9,9-dioctylfluorenyl-2,7-diyl}-co-{1,4-(2,5-dimethoxy) benzene}], poly[{9,9-dioctylfluorenyl-2,7-diyl}-co-{1,4-(2, 5-dimethoxy)benzene}], poly[(9,9-dioctylfluorenyl-2,7-diyl)-co-(1,4-ethylenylbenzene)], poly[(9,9-dioctylfluorenyl-2,7-diyl)-co-(1,4-diphenylene-vinylene-2-methoxy-5-{2-ethylhexyloxy}-benzene)], poly[(9,9-dihexylfluorenyl-2,7-divinylenefluorenylene)], poly[(9,9-dihexyl-2,7-(2-cyanodivinylene)-fluorenylene)], poly[(9,9-dioctylfluorenyl-2,7-diyl)-co-(1,4-vinylenephenylene)], poly[(9,9-dioctylfluorenyl-2,7-diyl)-co-(1,4-vinylenephenylene)], poly(9,9-dioctylfluorenyl-2,7-diyl, poly(9,9-dihexylfluorenyl-2,7-diyl), poly[9,9-di-(2-ethylhexyl)-fluorenyl-2,7-diyl], poly[(9,9-dioctylfluorenyl-2,7-diyl)-co-(N,N'-diphenyl)-N,N'-di(p-butyloxyphenyl)-1,4-diaminobenzene], poly[(9,9-dioctylfluorenyl-2,7-diyl)-alt-co-(N,N'-diphenyl)-N,N'-di(p-butyloxy-phenyl)-1,4-diaminobenzene], poly[(9,9-dihexylfluorenyl-2,7-diyl)-co-(1,4-benzo-{2,1',3}-thiadiazole)], poly[(9,9-dihexylfluorenyl-2,7-diyl)-alt-co-(9,10-anthracene)], poly [(9,9-dioctylfluorenyl-2,7-diyl)-alt-co-(N,N'-bis{4-butylphenyl}-benzidine-N,N'-{1,4-diphenylene})], poly[(9, 9-dihexylfluorenyl-2,7-diyl)-alt-co-(2-methoxy-5-{2-ethylhexyloxy}-1,4-phenylene)], poly[(9,9-dihexylfluorenyl-2,7-diyl)-co-(9,ethyl-3,6-carbazole)], poly [(9,9-dihexylfluorenyl-2,7-diyl)-alt-co-(9,ethyl-3,6-carbazole)], poly[(9,9-dihexylfluorenyl-2,7-diyl)-alt-co-(9, 9'-spirobifluorene-2,7-diyl], poly[(9,9-dihexylfluorenyl-2,7-diyl)-co-(2,5-p-xylene)], poly[(9,9-dihexylfluorenyl-2,7-diyl)-co-(3,5-pyridine)], poly[(9,9-dihexylfluorenyl-2,7-diyl)-co-(1,4-phenylene)], poly[(9,9-dihexylfluorenyl-2,7-diyl)-alt-co-(9,9-di-{5-pentanyl}-fluorenyl-2',7'-diyl; poly

[(9,9-dihexylfluorenyl-2,7-diyl)-co-(6,6'{2,2'-bipyridine})],
poly[(9,9-dihexylfluorenyl-2,7-diyl)-co-(6,6'-{2,2':6',2"-terpyridine})], poly[(9,9-dihexylfluorenyl-2,7-diyl)-co-(N,N'bis{p-butylphenyl}-1,4-diaminophenylene)], 8-hydroxyquinoline, fluorescein, rhodamine, xanthene (substituted or unsubstituted), substituted coumarin, substituted hydroxycoumarin, substituted or unsubstituted tetra-cyanoquinolines, ethidium bromide, propidium iodide, benzoxanthene yellow, bixbenzimide ((2'-[4-hydroxyphenyl]-5-[4-methyl-1-piperazinyl]-2,5'-bi-1H-benzimidazol), (2'-[4-ethoxyphenyl]-5-[4-methyl-1-piperazinyl]-2,5'-bi-1H-benzimidazol)), 4,6-diamidino-2-phenylindole (DAPI), lithium tetra(2-methyl-8-hydroxyquinolinato)boron, bis(8-hydroxyquinolinato)zinc, tris(benzoylacetonato)mono(phenanthroline)europium(III), tris(2-phenylpyridine)iridium(III); and tris(8-hydroxyquinolinato)gallium(III), tris(8-hydroxyquinolato)aluminum, tetra(2-methyl-8-hydroxyquinolato)boron, lithium salt, 4,4'-bis(9-ethyl-3-carbazovinylene)-1,1'-biphenyl, 9,10-di[(9-ethyl-3-carbazoyl)-vinylenyl)]-anthracene, 4,4'-bis(diphenylvinylenyl)-biphenyl, 1,4-bis(9-ethyl-3-carbazovinylene)-2-methoxy-5-(2-ethylhexyloxy)benzene, tris(benzoylacetonato)mono(phenanthroline)europium(III), tris(dibenzoylmethane)mono(phenanthroline)europium(III), tris(dibenzoylmethane)mono(5-aminophenanthroline)europium(III), tris(dinapthoylmethane)mono(phenanthroline)europium(III), tris(biphenoylmethane)mono(phenanthroline)europium(III), tris(dibenzoylmethane)mono(4,7-diphenylphenanthroline)europium(III), tris(dibenzoylmethane)mono(4,7-dimethyl-phenanthroline)europium(III), tris(dibenzoylmethane)mono(4,7-dihydroxy-phenanthroline)europium(III), tris(dibenzoylmethane)mono(4,7-dihydroxyloxy-phenanthroline)europium(III), lithium tetra(8-hydroxyquinolinato)boron; 4,4'-bis(9-ethyl-3-carbazovinylene)-1,1'-biphenyl, bis(8-hydroxyquinolinato)zinc, bis(2-methyl-8-hydroxyquinolinato)zinc, iridium(III) tris(2-phenylpyridine), tris(8-hydroxyquinoline)aluminum, tris[1-phenyl-3-methyl-4-(2,2-dimethylpropan-1-oyl)-pyrazolin-5-one]-terbium, and mixtures of two or more of any of these.

15. The device according to claim 11, wherein the light-emitting material is one that is not excited by an alternating current electrical field.

16. The device according to claim 6, wherein the electroluminescent phosphor is in the form of particles which are in direct contact with the light-emitting material.

17. The device according to claim 16, wherein the electroluminescent phosphor particles are coated with the light-emitting material.

18. The device according to claim 17, wherein the electroluminescent phosphor particles comprise ZnS:Cu which are coated with poly[2-methoxy-5-(2'-ethylhexyloxy)-1,4-phenylenevinylene].

19. The device according to claim 11, wherein the wavelength of light emitted by the light-emitting material is in the range of infrared, visible, or ultraviolet.

20. The device according to claim 6, wherein one or more dielectric layers that are separate from the insulating layer are present between the first electrode and the second electrode.

21. The device according to claim 6, wherein the first electrode or the second electrode is located adjacent a substrate that is plastic film or fabric.

22. The device according to claim 1, wherein at least two separate light-emitting materials are present, at least one of which is excited by excitation of the electroluminescent phosphor and at least one other of which emits light upon being excited by the excitation of a light-emitting material.

23. A method of making an electroluminescent device comprising the steps:
placing a phosphor and an insulating layer between a first electrode and a second electrode; and
placing a light-emitting material in operative contact with the phosphor, wherein the light-emitting material is placed between the first electrode and the second electrode and the first electrode and the second electrode are free of metals and metal oxides and wherein excitation of the electroluminescent phosphor by an alternating current electrical field causes the emission of light by the light-emitting material.

24. The method according to claim 23, wherein the phosphor is in direct contact with the light-emitting material.

25. The method according to claim 24, wherein the phosphor is in particulate form and is coated with the light-emitting material to form light-emitting particles.

26. The method according to claim 25, wherein the light-emitting particles are mixed with a dielectric material to form a light-emitting layer.

27. The method according to claim 26, wherein the first electrode is located adjacent a substrate.

28. The method according to claim 27, wherein a dielectric layer is placed between the first electrode and the light-emitting layer.

29. The method according to claim 23, wherein the first electrode and the second electrode comprise an intrinsically conductive polymer.

30. The method according to claim 29, wherein the phosphor comprises a material that is selected from the group consisting of $LaPO_4$, undoped or doped with one or more of Pr, Nd, Er, or Yb;
YOS, undoped or doped with Er;
$M^{IIA}M_2^{III}(S, Se)_4$, where $M^{IIA}$=Ca, Sr or Ba and $M^{III}$=Al, Ga, In, or Y, undoped, or doped with $Eu^{2+}$ or $Ce^{3+}$;
and mixtures thereof.

31. The method according to claim 23, wherein the light-emitting material is an organic material.

32. The method according to claim 31, wherein the light-emitting material is selected from the group consisting of: anthracene, undoped or doped with tetracene, aluminum tris(8-hydroxyquinolinate), poly-(p-phenylenevinylene) (PPV), poly[2-methoxy-5-(2'-ethyl)hexoxy-1,4-phenylenevinylene] (MEHPPV), poly[2-methoxy-5-(2'-ethylhexyloxy)-1,4-phenylenevinylene-co-4,4'-bisphenylenevinylene] (MEH-BP-PPV), poly[2-methoxy-5-(2'-ethylhexyloxy)-1-(cyanovinylene)phenylene (MEH-CN-PPV), poly[1,3-propanedioxy-1,4-phenylene-1,2-ethylene-(2,5-bis(trimethylsilyl)-1,4-phenylene)-1,2-ethylene-1,4-phenylene] (DiSiPV), Tb tris(acetylacetonate), Eu(1,10-phenanthroline)-tris(4,4,4-trifluoro-1-(2-thienyl)butane-1,3-dionate, Eu tris(dibenzoylmethanato)phenanthroline, Tb tris(acetylacetonate)phenanthroline, Eu(4,7-diphenylphenanthroline)-tris(4,4,4-trifluoro)-1-(2-thienyl)-butane-1,3-dionate, Nd(4,7-diphenylphenanthroline)(dibenzoylmethanato)$_3$, Eu(dibenzolmethanato)$_3$-2-(2-pyridyl)benzimidazole, Eu(dibenzolmethanato)$_2$-1-ethyl-2-(2-pyridyl)benzimidazole, Tb-[3-(5-phenyl-1,3,4-oxadiazol-2-yl)-2,4-pentanedionate]$_3$, lanthanide-tris(4-methylbenzoate), lanthanide-tris(4-methoxybenzoate), Tb tris(4-methylbenzoate), Tb tris(4-methoxybenzoylbenzoate), Eu tris(4-methoxybenzoylbenzoate), Tb-tris(tetradecylphethalate)phenanthroline, Tb-imidodiphosphinate, Tb 1-phenyl-3-methyl-4-(trimethylacetyl)pyrazol-4-one, poly-pyridine; poly(p-phenylenevinylene), poly[2-methoxy-5-(2'-ethylhexyloxy)-1,4-phenylenevinylene], poly[2-methoxy-5-(2-ethylhexyloxy)-1,4-phenylene-vinylene], poly[(2- methoxy-5-(2-ethylhexyloxy)-1,4-phenylene-vinylene)-alt-co-(4,4'-biphenylenevinylene)], poly[(9,9-dioctyl-2,7-divinylenefluorenylene)-alt-co-(9,10-anthracene)], poly[(9,9-dioctyl-2,7-divinylenefluorenylene)-alt-co-(4,4'-biphenylene)], poly[{9,9-dioctyl-2,7-divinylene-fluorenylene}-alt-co-{2-methoxy-5-(2-ethyl-hexyloxy)-1,4-phenylene}], poly[{9,9-dioctyl-2,7-bis(2-cyanovinylene-fluorenylene}-alt-co-{2-methoxy-5-(2-ethylhexyloxy)-1,4-phenylene}], poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N,N'-diphenylamino)-1,4-phenylene}], poly[{9-ethyl-3,6-bis(2-cyanovinylene)carbazolylene)}-alt-co-{2-methoxy-5-(2-ethylhexyloxy)-1,4-phenylene}], poly[(9,9-di(2-ethylhexyl)-fluorenyl-2,7-diyl)-co-(N,N'-diphenyl)-N,N'-di-(p-butylphenyl)-1,4-diaminobenzene], poly[2-(6-cyano-6-methylheptyloxy)-1,4-phenylene), poly[{9,9-dioctylfluorenyl-2,7-diyl}-co-{1,4-(2,5-dimethoxy)benzene}], poly[{9,9-dioctylfluorenyl-2,7-diyl}-co-{1,4-(2,5-dimethoxy)benzene}], poly[(9,9-dioctylfluorenyl-2,7-diyl)-co-(1,4-ethylenylbenzene)], poly[(9,9-dioctylfluorenyl-2,7-diyl)-co-(1,4-diphenylene-vinylene-2-methoxy-5-{2-ethylhexyloxy}-benzene)], poly[(9,9-dihexylfluorenyl-2,7-diyl-divinylenefluorenylene)], poly[(9,9-dihexyl-2,7-(2-cyanodivinylene)-fluorenylene)], poly[(9,9-dioctylfluorenyl-2,7-diyl)-co-(1,4-vinylenephenylene)], poly[(9,9-dioctylfluorenyl-2,7-diyl)-co-(1,4-vinylenephenylene)], poly(9,9-dioctylfluorenyl-2,7-diyl, poly(9,9-dihexylfluorenyl-2,7-diyl), poly[9,9-di-(2-ethylhexyl)-fluorenyl-2,7-diyl], poly[(9,9-dioctylfluorenyl-2,7-diyl)-co-(N,N'-diphenyl)-N,N'-di(p-butyloxyphenyl)-1,4-diaminobenzene)], poly[(9,9-dioctylfluorenyl-2,7-diyl)-alt-co-(N,N'-diphenyl)-N,N'-di(p-butyloxy-phenyl)-1,4-diaminobenzene)], poly[(9,9-dihexylfluorenyl-2,7-diyl)-co-(1,4-benzo-{2,1',3}-thiadiazole)], poly[(9,9-dihexylfluorenyl-2,7-diyl)-alt-co-(9,10-anthracene)], poly[(9,9-dioctylfluorenyl-2,7-diyl)-alt-co-(N,N'-bis{4-butylphenyl}-benzidine-N,N'-{1,4-diphenylene})], poly[(9,9-dihexylfluorenyl-2,7-diyl)-alt-co-(2-methoxy-5-{2-ethylhexyloxy}-1,4-phenylene)], poly[(9,9-dihexylfluorenyl-2,7-diyl)-co-(9,ethyl-3,6-carbazole)], poly[(9,9-dihexylfluorenyl-2,7-diyl)-alt-co-(9,ethyl-3,6-carbazole)], poly[(9,9-dihexylfluorenyl-2,7-diyl)-alt-co-(9,9'-spirobifluorene-2,7-diyl], poly[(9,9-dihexylfluorenyl-2,7-diyl)-co-(2,5-p-xylene)], poly[(9,9-dihexylfluorenyl-2,7-diyl)-co-(3,5-pyridine)], poly[(9,9-dihexylfluorenyl-2,7-diyl)-co-(1,4-phenylene)], poly[(9,9-dihexylfluorenyl-2,7-diyl)-alt-co-(9,9-di-{5-pentanyl}-fluorenyl-2',7'-diyl; poly[(9,9-dihexylfluorenyl-2,7-diyl)-co-(6,6'{2,2'-bipyridine})], poly[(9,9-dihexylfluorenyl-2,7-diyl)-co-(6,6'-{2,2':6',2"-terpyridine})], poly[(9,9-dihexylfluorenyl-2,7-diyl)-co-(N,N'bis{p-butylphenyl}-1,4-diaminophenylene)], 8-hydroxyquinoline, fluorescein, rhodamine, xanthene (substituted or unsubstituted), substituted coumarin, substituted hydroxycoumarin, substituted or unsubstituted tetra-cyanoquinolines, ethidium bromide, propidium iodide, benzoxanthene yellow, bixbenzimide ((2'-[4-hydroxyphenyl]-5-[4-methyl-1-piperazinyl]-2,5'-bi-1H-benzimidazol), (2'-[4-ethoxyphenyl]-5-[4-methyl-1-piperazinyl]-2,5'-bi-1H-benzimidazol)), 4,6-diamidino-2-phenylindole (DAPI), lithium tetra(2-methyl-8-hydroxyquinolinato)boron, bis(8-hydroxyquinolinato)zinc, tris(benzoylacetonato)mono(phenanthroline)europium(III), tris(2-phenylpyridine)iridium(III); and tris(8-hydroxyquinolinato)gallium(III), tris(8-hydroxyquinolato)aluminum, tetra(2-methyl-8-hydroxyquinolato)boron, lithium salt, 4,4'-bis(9-ethyl-3-carbazovinylene)-1,1'-biphenyl, 9,10-di[(9-ethyl-3-carbazoyl)-vinylenyl]-anthracene, 4,4'-bis(diphenylvinylenyl)-biphenyl, 1,4-bis(9-ethyl-3-carbazovinylene)-2-methoxy-5-(2-ethylhexyloxy)benzene, tris(benzoylacetonato)mono(phenanthroline)europium(III), tris(dibenzoylmethane)mono(phenanthroline)europium(III), tris(dibenzoylmethane)mono(5-aminophenanthroline)europium(III), tris(dinapthoylmethane)mono(phenanthroline)europium(III), tris(biphenoylmethane)mono(phenanthroline)europium(III), tris(dibenzoylmethane)mono(4,7-diphenylphenanthroline)europium(III), tris(dibenzoylmethane)mono(4,7-dimethyl-phenanthroline)europium(III), tris(dibenzoylmethane)mono(4,7-dihydroxyphenanthroline)europium(III), tris(dibenzoylmethane)mono(4,7-dihydroxyloxy-phenanthroline)europium(III), lithium tetra(8-hydroxyquinolinato)boron; 4,4'-bis(9-ethyl-3-carbazovinylene)-1,1'-biphenyl, bis(8-hydroxyquinolinato)zinc, bis(2-methyl-8-hydroxyquinolinato)zinc, iridium(III) tris(2-phenylpyridine), tris(8-hydroxyquinoline)aluminum, tris[1-phenyl-3-methyl-4-(2,2-dimethylpropan-1-oyl)-pyrazolin-5-one]-terbium, and mixtures of two or more of any of these.

33. The method according to claim 23, wherein all steps are carried out under ambient conditions of temperature and atmosphere.

34. An electroluminescent display comprising
an electroluminescent phosphor in operative contact with a light-emitting material wherein excitation of the electroluminescent phosphor by an alternating current electrical field causes the emission of light by the light-emitting material; and
a first electrode and a second electrode, between which is located the electroluminescent phosphor and an insulating layer.

35. A method of providing light comprising applying an AC electrical field to a luminescent device comprising an electroluminescent phosphor which is in operative contact with a light-emitting material, wherein both the electroluminescent phosphor and the light-emitting material are located between a first electrode and a second electrode, wherein the first electrode and the second electrode are free of metal or metal oxides, and wherein excitation of the electroluminescent phosphor by an alternating current electrical field causes the emission of light by the light-emitting material.

36. The method according to claim 35, wherein the electroluminescent phosphor is present in an insulating layer which is located between a first electrode and a second electrode.

37. The method according to claim 36, wherein the first electrode and the second electrode are free of metals and metal oxides.

38. The method according to claim 35, wherein the electroluminescent phosphor is in the form of particles which are in direct contact with the light-emitting material.

39. The method according to claim 35, wherein the electroluminescent phosphor particles are coated with the light-emitting material.

40. The method according to claim 35, wherein the electroluminescent phosphor particles comprise ZnS:Cu which are coated with poly[2-methoxy-5-(2'-ethylhexyloxy)-1,4-phenylenevinylene].

41. The method according to claim 35, wherein the wavelength of light emitted by the light-emitting material is in the range of infrared, visible, or ultraviolet.

42. The method according to claim 35, wherein the wavelength of light emitted by the light-emitting material comprises infrared light.

43. The method according to claim 36, wherein at least one of the first electrode or the second electrode comprises an intrinsically conductive polymer.

44. The method according to claim 36, wherein the first electrode and the second electrode comprise a substituted or unsubstituted intrinsically conductive polymer that is selected from the group consisting of polyaniline, polyacetylene, poly-p-phenylene, poly-m-phenylene, polyphenylene sulfide, polypyrrole, polythiophene, and polycarbazole.

45. The method according to claim 36, wherein the first electrode and the second electrode comprise poly(3,4-ethylenedioxythiophene).

46. The method according to claim 36, wherein the light-emitting material is located in the insulating layer.

47. The method according to claim 35, wherein the electroluminescent phosphor is selected from the group consisting of:
CdSe;
InAs;
$LaPO_4$, undoped or doped with one or more of Pr, Nd, Er, or Yb;
YOS, undoped or doped with Er;
ZnS, undoped, or doped with Ag, Cu, Mn, Tb, TbF, or $TbF_3$;
ZnSe; undoped or doped with Mn, or Cu;
ZnCdS;
$M^{IIA}M_2^{III}(S, Se)_4$, where $M^{IIA}$=Ca, Sr or Ba, and $M^{III}$=Al, Ga, In, Y, or is optionally absent, where the compound is undoped, or doped with $Eu^{2+}$ or $Ce^{3+}$;
and mixtures thereof.

48. The method according to claim 35, wherein the light-emitting material is a material which is excited when in operative contact with the excited electroluminescent phosphor and which is capable of emitting light of a wavelength that is different than the light emitted by the electroluminescent phosphor.

49. The method according to claim 35, wherein the light-emitting material is an organic material.

50. The method according to claim 35, wherein the light-emitting material is selected from the group consisting of: anthracene, undoped or doped with tetracene, aluminum tris(8-hydroxyquinolinate), poly-(p-phenylenevinylene) (PPV), poly[2-methoxy-5-(2'-ethyl)hexoxy-1,4-phenylenevinylene] (MEHPPV), poly[2-methoxy-5-(2'-ethylhexyloxy)-1,4-phenylenevinylene-co-4,4'-bisphenylenevinylene] (MEH-BP-PPV), poly[2-methoxy-5-(2'-ethylhexyloxy)-1-(cyanovinylene)phenylene (MEH-CN-PPV), poly[1,3-propanedioxy-1,4-phenylene-1,2-ethylene-(2,5-bis(trimethylsilyl)-1,4-phenylene)-1,2-ethylene-1,4-phenylene] (DiSiPV), Tb tris(acetylacetonate), Eu(1,10-phenanthroline)-tris(4,4,4-trifluoro-1-(2-thienyl)butane-1,3-dionate, Eu tris(dibenzoylmethanato)phenanthroline, Tb tris(acetylacetonate)phenanthroline, Eu(4,7-diphenylphenanthroline)-tris(4,4,4-trifluoro)-1-(2-thienyl)-butane-1,3-dionate, Nd(4,7-diphenylphenanthroline) (dibenzoylmethanato)$_3$, Eu(dibenzolmethanato)$_3$-2-(2-pyridyl)benzimidazole, Eu(dibenzolmethanato)$_2$-1-ethyl-2-(2-pyridyl)benzimidazole, Tb-[3-(5-phenyl-1,3,4-oxadiazol-2-yl)-2,4-pentanedionate]$_3$, lanthanide-tris(4-methylbenzoate), lanthanide-tris(4-methoxybenzoate), Tb tris(4-methylbenzoate), Tb tris(4-methoxybenzoylbenzoate), Eu tris(4-methoxybenzoylbenzoate), Tb-tris(tetradecylphethalate)phenanthroline, Tb-imidodiphosphinate, Tb 1-phenyl-3-methyl-4-(trimethylacetyl)pyrazol-4-one, poly-pyridine; poly(p-phenylenevinylene), poly[2-methoxy-5-(2'-ethylhexyloxy)-1,4-phenylenevinylene], poly[2-methoxy-5-(2-ethylhexyloxy)-1,4-phenylene-vinylene], poly[(2-methoxy-5-(2-ethylhexyloxy)-1,4-phenylene-vinylene)-alt-co-(4,4'-biphenylenevinylene)], poly[(9,9-dioctyl-2,7-divinylenefluorenylene)-alt-co-(9,10-anthracene)], poly[(9,9-dioctyl-2,7-divinylenefluorenylene)-alt-co-(4,4'-biphenylene)], poly[{9,9-dioctyl-2,7-divinylenefluorenylene}-alt-co-{2-methoxy-5-(2-ethyl-hexyloxy)-1,4-phenylene}], poly[{9,9-dioctyl-2,7-bis(2-cyanovinylenefluorenylene}-alt-co-{2-methoxy-5-(2-ethylhexyloxy)-1,4-phenylene}], poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N,N'-diphenylamino)-1,4-phenylene}], poly[{9-ethyl-3,6-bis(2-cyanovinylene)carbazolylene)}-alt-co-{2-methoxy-5-(2-ethylhexyloxy)-1,4-phenylene}], poly[(9,9-di(2-ethylhexyl)-fluorenyl-2,7-diyl)-co-(N,N'-diphenyl)-N,N'-di-(p-butylphenyl)-1,4-diaminobenzene], poly[2-(6-cyano-6-methylheptyloxy)-1,4-phenylene], poly[{9,9-dioctylfluorenyl-2,7-diyl}-co-{1,4-(2,5-dimethoxy)benzene}], poly[{9,9-dioctylfluorenyl-2,7-diyl}-co-{1,4-(2,5-dimethoxy)benzene}], poly[(9,9-dioctylfluorenyl-2,7-diyl)-co-(1,4-ethylenylbenzene)], poly[(9,9-dioctylfluorenyl-2,7-diyl)-co-(1,4-diphenylene-vinylene-2-methoxy-5-{2-ethylhexyloxy}-benzene)], poly[(9,9-dihexylfluorenyl-2,7-divinylenefluorenylene)], poly[(9,9-dihexyl-2,7-(2-cyanodivinylene)-fluorenylene)], poly[(9,9-dioctylfluorenyl-2,7-diyl)-co-(1,4-vinylenephenylene)], poly[(9,9-dioctylfluorenyl-2,7-diyl)-co-(1,4-vinylenephenylene)], poly(9,9-dioctylfluorenyl-2,7-diyl, poly(9,9-dihexylfluorenyl-2,7-diyl), poly[9,9-di-(2-ethylhexyl)-fluorenyl-2,7-diyl], poly[(9,9-dioctylfluorenyl-2,7-diyl)-co-(N,N'-diphenyl)-N,N'-di(p-butyloxyphenyl)-1,4-diaminobenzene], poly[(9,9-dioctylfluorenyl-2,7-diyl)-alt-co-(N,N'-diphenyl)-N,N'-di(p-butyloxy-phenyl)-1,4-diaminobenzene], poly[(9,9-dihexylfluorenyl-2,7-diyl)-co-(1,4-benzo-{2,1',3}-thiadiazole)], poly[(9,9-dihexylfluorenyl-2,7-diyl)-alt-co-(9,10-anthracene)], poly[(9,9-dioctylfluoren-2,7-diyl)-alt-co-(N,N'-bis{4-butylphenyl}-benzidine-N,N'-{1,4-diphenylene})], poly[(9,9-dihexylfluorenyl-2,7-diyl)-alt-co-(2-methoxy-5-(2-ethylhexyloxy)-1,4-phenylene)], poly[(9,9-dihexylfluorenyl-2,7-diyl)-co-(9,ethyl-3,6-carbazole)], poly[(9,9-dihexylfluorenyl-2,7-diyl)-alt-co-(9,ethyl-3,6-carbazole)], poly[(9,9-dihexylfluorenyl-2,7-diyl)-alt-co-(9,9'-spirobifluorene-2,7-diyl], poly[(9,9-dihexylfluorenyl-2,7-diyl)-co-(2,5-p-xylene)], poly[(9,9-dihexylfluorenyl-2,7-diyl)-co-(3,5-pyridine)], poly[(9,9-dihexylfluorenyl-2,7-diyl)-co-(1,4-phenylene)], poly[(9,9-dihexylfluorenyl-2,7-diyl)-alt-co-(9,9-di-{5-pentanyl}-fluorenyl-2',7'-diyl; poly[(9,9-dihexylfluorenyl-2,7-diyl)-co-(6,6'{2,2'-bipyridine})], poly[(9,9-dihexylfluorenyl-2.7-diyl)-co-(6,6'-{2,2':6',2"-terpyridine})], poly[(9,9-dihexylfluorenyl-2,7-diyl)-co-(N,N'bis(p-butylphenyl)-1,4-diaminophenylene)], 8-hydroxyquinoline, fluorescein, rhodamine, xanthene (substituted or unsubstituted), substituted coumarin, substituted hydroxycoumarin, substituted or unsubstituted tetra-cyanoquinolines, ethidium bromide, propidium iodide, benzoxanthene yellow, bixbenzimide ((2'-[4-hydroxyphenyl]-5-[4-methyl-1-piperazinyl]-2,5'-bi-1H-benzimidazol), (2'-[4-ethoxyphenyl]-5-[4-methyl-1-piperazinyl]-2,5'-bi-1H-benzimidazol)), 4,6-diamidino-2-phenylindole (DAPI), lithium tetra(2-methyl-8-hydroxyquinolinato)boron, bis(8-hydroxyquinolinato)zinc, tris(benzoylacetonato)mono(phenanthroline)europium(III), tris(2-phenylpyridine)iridium(III); and tris(8-hydroxyquinolinato)gallium(III), tris(8-hydroxyquinolato) aluminum, tetra(2-methyl-8-hydroxyquinolato)boron, lithium salt, 4,4'-bis(9-ethyl-3-carbazovinylene)-1,1'-biphenyl, 9,10-di[(9-ethyl-3-carbazoyl)-vinylenyl]-anthracene, 4,4'-bis(diphenylvinylenyl)-biphenyl, 1,4-bis(9-ethyl-3-carbazovinylene)-2-methoxy-5-(2-ethylhexyloxy)benzene, tris(benzoylacetonato)mono(phenanthroline)europium(III), tris(dibenzoylmethane)mono(phenanthroline)europium(III), tris(dibenzoylmethane)mono(5-aminophenanthroline)europium(III), tris(dinapthoylmethane)mono(phenanthroline)europium(III), tris(biphenoylmethane)mono(phenanthroline)europium(III), bis(dibenzoylmethane)mono(4,7-diphenylphenanthroline)europium(III), tris(dibenzoylmethane)mono(4,7-dimethyl-phenanthroline)europium(III), tris(dibenzoylmethane)mono(4,7-dihydroxyphenanthroline)europium(III), tris(dibenzoylmethane)mono(4,7-dihydroxyloxy-phenanthroline)europium(III), lithium tetra(8-hydroxyquinolinato)boron; 4,4'-bis(9-ethyl-3-carbazovinylene)-1,1'-biphenyl, bis(8-hydroxyquinolinato)zinc, bis(2-methyl-8-hydroxyquinolinato)zinc, iridium(III) tris(2-phenylpyridine), tris(8-hydroxyquinoline)aluminum, tris[1-phenyl-3-methyl-4-(2,2-dimethylpropan-1-oyl)-pyrazolin-5-one]-terbium, and mixtures of two or more of any of these.

51. The method according to claim 35, wherein the light-emitting material is one that is not excited by an alternating current electrical field.

52. The method according to claim 35, wherein at least two separate light-emitting materials are present, at least one of which is excited by excitation of the electroluminescent phosphor and at least one other of which emits light upon being excited by the excitation of a light-emitting material.

53. A luminescent device comprising an electroluminescent phosphor in operative contact with a light-emitting material that is selected from the group consisting of poly-(p-phenylenevinylene) (PPV), poly[2-methoxy-5-(2'-ethyl)hexoxy-1,4-phenylenevinylene] (MEHPPV), poly[2-methoxy-5-(2'-ethylhexyloxy)-1,4-phenylenevinylene-co-4,4'-bisphenylenevinylene] (MEH-BP-PPV), poly[2-methoxy-5-(2'-ethylhexyloxy)-1-(cyanovinylene)phenylene (MEH-CN-PPV), poly[1,3-propanedioxy-1,4-phenylene-1,2-ethylene-(2,5-bis(trimethylsilyl)-1,4-phenylene)-1,2-ethylene-1,4-phenylene] (DiSiPV), polypyridine, poly(p-phenylenevinylene), poly[2-methoxy-5-(2'-ethylhexyloxy)-1,4-phenylenevinylene], poly[2-methoxy-5-(2-ethylhexyloxy)-1,4-phenylene-vinylene], poly[(2-methoxy-5-(2-ethylhexyloxy)-1,4-phenylene-vinylene)-alt-co-(4,4'-biphenylene-vinylene)], poly[(9,9-dioctyl-2,7-divinylenefluorenylene)-alt-co-(9,10-anthracene)], poly[(9,9-dioctyl-2,7-divinylenefluorenylene)-alt-co-(4,4'-biphenylene)], poly[{9,9-dioctyl-2,7-divinylenefluorenylene}-alt-co-{2-methoxy-5-(2-ethylhexyloxy)-1,4-phenylene}], poly[{9,9-dioctyl-2,7-bis(2-cyanovinylene-fluorenylene}-alt-co-{2-methoxy-5-(2-ethylhexyloxy)-1,4-phenylene}], poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N,N'-diphenylamino)-1,4-phenylene}], poly[{9-ethyl-3,6-bis(2-cyanovinylene)carbazolylene)}-alt-co-{2-methoxy-5-(2-ethylhexyloxy)-1,4-phenylene}], poly[(9,9-di(2-ethylhexyl)-fluorenyl-2,7-diyl)-co-(N,N'-diphenyl)-N,N'-di-(p-butylphenyl)-1,4-diaminobenzene], poly[2-(6-cyano-6-methylheptyloxy)-1,4-phenylene), poly[{9,9-dioctylfluorenyl-2,7-diyl}-co-{1,4-(2,5-dimethoxy)benzene}], poly[{9,9-dioctylfluorenyl-2,7-diyl}-co-{1,4-(2,5-dimethoxy)benzene}], poly[(9,9-dioctylfluorenyl-2,7-diyl)-co-(1,4-ethylenylbenzene)], poly[(9,9-dioctylfluorenyl-2,7-diyl)-co-(1,4-diphenylene-vinylene-2-methoxy-5-{2-ethylhexyloxy}-benzene)], poly[(9,9-dihexylfluorenyl-2,7-diyl)-2,7-divinylenefluorenylene)], poly[(9,9-dihexyl-2,7-(2-cyanodivinylene)-fluorenylene)], poly[(9,9-dioctylfluorenyl-2,7-diyl)-co-(1,4-vinylenephenylene)], poly[(9,9-dioctylfluorenyl-2,7-diyl)-co-(1,4-vinylenephenylene)], poly(9,9-dioctylfluorenyl-2,7-diyl, poly(9,9-dihexylfluorenyl-2,7-diyl), poly[9,9-di-(2-ethylhexyl)-fluorenyl-2,7-diyl], poly[(9,9-dioctylfluorenyl-2,7-diyl)-co-(N,N'-diphenyl)-N,N'-di(p-butyloxyphenyl)-1,4-diaminobenzene)], poly[(9,9-dioctylfluorenyl-2,7-diyl)-alt-co-(N,N'-diphenyl)-N,N'-di(p-butyloxy-phenyl)-1,4-diaminobenzene)], poly[(9,9-dihexylfluorenyl-2,7-diyl)-co-(1,4-benzo-{2,1',3}-thiadiazole)], poly[(9,9-dihexylfluorenyl-2,7-diyl)-alt-co-(9,10-anthracene)], poly[(9,9-dioctylfluorenyl-2,7-diyl)-alt-co-(N,N'-bis{4-butylphenyl}-benzidine-N,N'-{1,4-diphenylene})], poly[(9,9-dihexylfluorenyl-2,7-diyl)-alt-co-(2-methoxy-5-{2-ethylhexyloxy}-1,4-phenylene)], poly[(9,9-dihexylfluorenyl-2,7-diyl)-co-(9,ethyl-3,6-carbazole)], poly[(9,9-dihexylfluorenyl-2,7-diyl)-alt-co-(9,ethyl-3,6-carbazole)], poly[(9,9-dihexylfluorenyl-2,7-diyl)-alt-co-(9,9'-spirobifluorene-2,7-diyl], poly[(9,9-dihexylfluorenyl-2,7-diyl)-co-(2,5-p-xylene)], poly[(9,9-dihexylfluorenyl-2,7-diyl)-co-(3,5-pyridine)], poly[(9,9-dihexylfluorenyl-2,7-diyl)-co-(1,4-phenylene)], poly[(9,9-dihexylfluorenyl-2,7-diyl)-alt-co-(9,9-di-{5-pentanyl}-fluorenyl-2',7'-diyl; poly[(9,9-dihexylfluorenyl-2,7-diyl)-co-(6,6'{2,2'-bipyridine})], poly[(9,9-dihexylfluorenyl-2,7-diyl)-co-(6,6'-{2,2':6',2''-terpyridine})], poly[(9,9-dihexylfluorenyl-2,7-diyl)-co-(N,N'bis{p-butylphenyl}-1,4-diaminophenylene)], and mixtures thereof, wherein the electroluminescent phosphor is present in an insulating layer which is located between a first electrode and a second electrode, and wherein excitation of the electroluminescent phosphor by an alternating current electrical field causes the emission of light by the light-emitting material.

54. The device according to claim 53, wherein the first electrode and the second electrode comprise an intrinsically conductive polymer.

55. The device according to claim 53, wherein the first electrode and the second electrode comprise a substituted or unsubstituted intrinsically conductive polymer that is selected from the group consisting of polyaniline, polyacetylene, poly-p-phenylene, poly-m-phenylene, polyphenylene sulfide, polypyrrole, polythiophene, and polycarbazole.

56. The device according to claim 53, wherein the light-emitting material is located in the insulating layer.

57. The device according to claim 53, wherein the electroluminescent phosphor is selected from the group consisting of:
CdSe;
InAs;
LaPO$_4$, undoped or doped with one or more of Pr, Nd, Er, or Yb;
YOS, undoped or doped with Er;
ZnS, undoped, or doped with Ag, Cu, Mn, Tb, TbF, or TbF$_3$;
ZnSe; undoped or doped with Mn, or Cu;
ZnCdS;
M$^{IIA}$M$_2^{III}$(S, Se)$_4$, where M$^{IIA}$=Ca, Sr or Ba, and M$^{III}$=Al, Ga, In, Y, or is optionally absent, where the compound is undoped, or doped with Eu$^{2+}$ or Ce$^{3+}$;
and mixtures thereof.

58. The device according to claim 53, wherein the electroluminescent phosphor particles are coated with the light-emitting material.

59. The device according to claim 53, wherein the electroluminescent phosphor particles comprise ZnS:Cu which are coated with poly[2-methoxy-5-(2'-ethylhexyloxy)-1,4-phenylenevinylene].

60. The device according to claim 53, wherein at least two separate light-emitting materials are present, at least one of which is excited by excitation of the electroluminescent phosphor and at least one other of which emits light upon being excited by the excitation of a light-emitting material.

61. A luminescent device comprising an electroluminescent phosphor particle that is coated with a light-emitting material wherein excitation of the electroluminescent phosphor by an alternating current electrical field causes the emission of light by the light-emitting material.

62. The device according to claim 61, wherein the electroluminescent phosphor is present in an insulating layer which is located between a first electrode and a second electrode.

63. The device according to claim 62, wherein the first electrode and the second electrode comprise an intrinsically conductive polymer.

64. The device according to claim 63, wherein the first electrode and the second electrode comprise a substituted or unsubstituted intrinsically conductive polymer that is selected from the group consisting of polyaniline, polyacetylene, poly-p-phenylene, poly-m-phenylene, polyphenylene sulfide, polypyrrole, polythiophene, and polycarbazole.

65. The device according to claim 62, wherein the electroluminescent phosphor can be excited by an alternating current electric field and can emit light at a first wavelength.

66. The device according to claim 62, wherein the electroluminescent phosphor is selected from the group consisting of:
CdSe;
InAs;
$LaPO_4$, undoped or doped with one or more of Pr, Nd, Er, or Yb;
YOS, undoped or doped with Er;
ZnS, undoped, or doped with Ag, Cu, Mn, Tb, TbF, or $TbF_3$;
ZnSe; undoped or doped with Mn, or Cu;
ZnCdS;
$M^{IIA}M_2^{III}(S, Se)_4$, where $M^{IIA}$=Ca, Sr or Ba, and $M^{III}$=Al, Ga, In, Y, or is optionally absent, where the compound is undoped, or doped with $Eu^{2+}$ or $Ce^{3+}$;
and mixtures thereof.

67. The device according to claim 62, wherein the light-emitting material is a material which is excited when in operative contact with the excited electroluminescent phosphor and which is capable of emitting light of a wavelength that is different than the light emitted by the electroluminescent phosphor.

68. The device according to claim 62, wherein the light-emitting material is selected from the group consisting of: anthracene, undoped or doped with tetracene, aluminum tris(8-hydroxyquinolinate), poly-(p-phenylenevinylene) (PPV), poly[2-methoxy-5-(2'-ethyl)hexoxy-1,4-phenylenevinylene] (MEHPPV), poly[2-methoxy-5-(2'-ethylhexyloxy)-1,4-phenylenevinylene-co-4,4'-bisphenylenevinylene] (MEH-BP-PPV), poly[2-methoxy-5-(2'-ethylhexyloxy)-1-(cyanovinylene)phenylene (MEH-CN-PPV), poly[1,3-propanedioxy-1,4-phenylene-1,2-ethylene-(2,5-bis(trimethylsilyl)-1,4-phenylene)-1,2-ethylene-1,4-phenylene] (DiSiPV), Tb tris(acetylacetonate), Eu(1,10-phenanthroline)-tris(4,4,4-trifluoro-1-(2-thienyl)butane-1,3-dionate, Eu tris(dibenzoylmethanato)phenanthroline, Tb tris(acetylacetonate)phenanthroline, Eu(4,7-diphenylphenanthroline)-tris(4,4,4-trifluoro)-1-(2-thienyl)-butane-1,3-dionate, Nd(4,7-diphenylphenanthroline)(dibenzoylmethanato)$_3$, Eu(dibenzolmethanato)$_3$-2-(2-pyridyl)benzimidazole, Eu(dibenzolmethanato)$_2$-1-ethyl-2-(2-pyridyl)benzimidazole, Tb-[3-(5-phenyl-1,3,4-oxadiazol-2-yl)-2,4-pentanedionate]$_3$, lanthanide-tris(4-methylbenzoate), lanthanide-tris(4-methoxybenzoate), Tb tris(4-methylbenzoate), Tb tris(4-methoxybenzoylbenzoate), Eu tris(4-methoxybenzoylbenzoate), Tb-tris(tetradecylphethalate)phenanthroline, Tb-imidodiphosphinate, Tb 1-phenyl-3-methyl-4-(trimethylacetyl)pyrazol-4-one, polypyridine; poly(p-phenylenevinylene), poly[2-methoxy-5-(2'-ethylhexyloxy)-1,4-phenylenevinylene], poly[2-methoxy-5-(2-ethylhexyloxy)-1,4-phenylene-vinylene], poly[(2-methoxy-5-(2-ethylhexyloxy)-1,4-phenylene-vinylene)-alt-co-(4,4'-biphenylenevinylene)], poly[(9,9-dioctyl-2,7-divinylenefluorenylene)-alt-co-(9,10-anthracene)], poly[(9,9-dioctyl-2,7-divinylenefluorenylene)-alt-co-(4,4'-biphenylene)], poly[{9,9-dioctyl-2,7-divinylenefluorenylene}-alt-co-{2-methoxy-5-(2-ethyl-hexyloxy)-1,4-phenylene}], poly[{9,9-dioctyl-2,7-bis(2-cyanovinylenefluorenylene}-alt-co-{2-methoxy-5-(2-ethylhexyloxy)-1,4-phenylene}], poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N,N'-diphenylamino)-1,4-phenylene}], poly[{9-ethyl-3,6-bis(2-cyanovinylene)carbazolylene)}-alt-co-{2-methoxy-5-(2-ethylhexyloxy)-1,4-phenylene}], poly[(9,9-di(2-ethylhexyl)-fluorenyl-2,7-diyl)-co-(N,N'-diphenyl)-N,N'-di-(p-butylphenyl)-1,4-diaminobenzene], poly[2-(6-cyano-6-methylheptyloxy)-1,4-phenylene), poly[{9,9-dioctylfluorenyl-2,7-diyl}-co-{1,4-(2,5-dimethoxy)benzene}], poly[{9,9-dioctylfluorenyl-2,7-diyl}-co-{1,4-(2,5-dimethoxy)benzene}], poly[(9,9-dioctylfluorenyl-2,7-diyl)-co-(1,4-ethylenylbenzene)], poly[(9,9-dioctylfluorenyl-2,7-diyl)-co-(1,4-diphenylene-vinylene-2-methoxy-5-{2-ethylhexyloxy}-benzene)], poly[(9,9-dihexylfluorenyl-2,7-diyl-divinylenefluorenylene)], poly[(9,9-dihexyl-2,7-(2-cyanodivinylene)-fluorenylene)], poly[(9,9-dioctylfluorenyl-2,7-diyl)-co-(1,4-vinylenephenylene)], poly[(9,9-dioctylfluorenyl-2,7-diyl)-co-(1,4-vinylenephenylene)], poly(9,9-dioctylfluorenyl-2,7-diyl, poly(9,9-dihexylfluorenyl-2,7-diyl), poly[9,9-di-(2-ethylhexyl)-fluorenyl-2,7-diyl], poly[(9,9-dioctylfluorenyl-2,7-diyl)-co-(N,N'-diphenyl)-N,N'-di(p-butyloxyphenyl)-1,4-diaminobenzene], poly[(9,9-dioctylfluorenyl-2,7-diyl)-alt-co-(N,N'-diphenyl)-N,N'-di(p-butyloxy-phenyl)-1,4-diaminobenzene], poly[(9,9-dihexylfluorenyl-2,7-diyl)-co-(1,4-benzo-{2,1',3}-thiadiazole)], poly[(9,9-dihexylfluorenyl-2,7-diyl)-alt-co-(9,10-anthracene)], poly [(9,9-dioctylfluorenyl-2,7-diyl)-alt-co-(N,N'-bis{4-butylphenyl}-benzidine-N,N'-{1,4-diphenylene})], poly[(9,9-dihexylfluorenyl-2,7-diyl)-alt-co-(2-methoxy-5-{2-ethylhexyloxy}-1,4-phenylene)], poly[(9,9-dihexylfluorenyl-2,7-diyl)-co-(9,ethyl-3,6-carbazole)], poly[(9,9-dihexylfluorenyl-2,7-diyl)-alt-co-(9,ethyl-3,6-carbazole)], poly[(9,9-dihexylfluorenyl-2,7-diyl)-alt-co-(9,9'-spirobifluorene-2,7-diyl], poly[(9,9-dihexylfluorenyl-2,7-diyl)-co-(2,5-p-xylene)], poly[(9,9-dihexylfluorenyl-2,7-diyl)-co-(3,5-pyridine)], poly[(9,9-dihexylfluorenyl-2,7-diyl)-co-(1,4-phenylene)], poly[(9,9-dihexylfluorenyl-2,7-diyl)-alt-co-(9,9-di-{5-pentanyl}-fluorenyl-2',7'-diyl; poly [(9,9-dihexylfluorenyl-2,7-diyl)-co-(6,6'{2,2'-bipyridine})], poly[(9,9-dihexylfluorenyl-2,7-diyl)-co-(6,6'-{2,2':6',2"-terpyridine})], poly[(9,9-dihexylfluorenyl-2,7-diyl)-co-(N,N'bis{p-butylphenyl}-1,4-diaminophenylene)], 8-hydroxyquinoline, fluorescein, rhodamine, xanthene (substituted or unsubstituted), substituted coumarin, substituted hydroxycoumarin, substituted or unsubstituted tetra-cyanoquinolines, ethidium bromide, propidium iodide, benzoxanthene yellow, bixbenzimide ((2'-[4-hydroxyphenyl]-5-[4-methyl- 1-piperazinyl]-2,5'-bi-1H-benzimidazol), (2'-[4-ethoxyphenyl]-5-[4-methyl-1-piperazinyl]-2,5'-bi-1H-benzimidazol)), 4,6-diamidino-2-phenylindole (DAPI), lithium tetra(2-methyl-8-hydroxyquinolinato)boron, bis(8-hydroxyquinolinato)zinc, tris(benzoylacetonato)mono(phenanthroline)europium(III), tris(2-phenylpyridine)iridium(III); and tris(8-hydroxyquinolinato)gallium(III), tris(8-hydroxyquinolato)aluminum, tetra(2-methyl-8-hydroxyquinolato)boron, lithium salt, 4,4'-bis(9-ethyl-3-carbazovinylene)-1,1'-biphenyl, 9,10-di[(9-ethyl-3-carbazoyl)-vinylenyl)]-anthracene, 4,4'-bis(diphenylvinylenyl)-biphenyl, 1,4-bis(9-ethyl-3-carbazovinylene)-2-methoxy-5-(2-ethylhexyloxy)benzene, tris(benzoylacetonato)mono(phenanthroline)europium(III), tris(dibenzoylmethane)mono(phenanthroline)europium(III), tris(dibenzoylmethane)mono(5-aminophenanthroline)europium(III), tris(dinapthoylmethane)mono(phenanthroline)europium(III), tris(biphenoylmethane)mono(phenanthroline)europium(III), tris(dibenzoylmethane)mono(4,7-diphenylphenanthroline)europium(III), tris(dibenzoylmethane)mono(4,7-dimethyl-phenanthroline)europium(III), tris(dibenzoylmethane)mono(4,7-dihydroxy-phenanthroline)europium(III), tris(dibenzoylmethane)mono(4,7-dihydroxyloxy-phenanthroline)europium(III), lithium tetra(8-hydroxyquinolinato)boron; 4,4'-bis(9-ethyl-3-carbazovinylene)-1,1'-biphenyl, bis(8-hydroxyquinolinato)zinc, bis(2-methyl-8-hydroxyquinolinato)zinc, iridium(III) tris(2-phenylpyridine), tris(8-hydroxyquinoline)aluminum, tris[1-phenyl-3-methyl-4-(2,2-dimethylpropan-1-oyl)-pyrazolin-5-one]-terbium, and mixtures of two or more of any of these.

69. The device according to claim 62, wherein the wavelength of light emitted by the light-emitting material is in the range of infrared, visible, or ultraviolet.

70. The device according to claim 62, wherein at least two separate light-emitting materials are present, at least one of which is excited by excitation of the electroluminescent phosphor and at least one other of which emits light upon being excited by the excitation of a light-emitting material.

* * * * *